United States Patent

Wu et al.

(10) Patent No.: US 9,349,769 B2
(45) Date of Patent: May 24, 2016

(54) IMAGE SENSOR COMPRISING REFLECTIVE GUIDE LAYER AND METHOD OF FORMING THE SAME

(71) Applicant: Taiwan Semiconductor Manufacturing Company, Ltd., Hsin-Chu (TW)

(72) Inventors: Wei Chuang Wu, Tainan (TW); Jhy-Jyi Sze, Hsin-Chu (TW); Yu-Jen Wang, Kaohsiung (TW); Yen-Chang Chu, Tainan (TW); Shyh-Fann Ting, Tainan (TW); Ching-Chun Wang, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 34 days.

(21) Appl. No.: 14/068,596

(22) Filed: Oct. 31, 2013

(65) Prior Publication Data

US 2015/0115382 A1   Apr. 30, 2015

(51) Int. Cl.
*H01L 31/0232* (2014.01)
*H01L 27/146* (2006.01)

(52) U.S. Cl.
CPC ...... *H01L 27/14645* (2013.01); *H01L 27/1464* (2013.01); *H01L 27/14621* (2013.01); *H01L 27/14629* (2013.01); *H01L 27/14627* (2013.01)

(58) Field of Classification Search
CPC .............. H01L 27/14645; H01L 27/14621; H01L 27/14629; H01L 27/1464
USPC ........................................................ 257/623
See application file for complete search history.

(56) References Cited

U.S. PATENT DOCUMENTS

| 7,768,088 | B2 * | 8/2010 | Fukunaga | 257/436 |
|---|---|---|---|---|
| 2006/0113622 | A1 * | 6/2006 | Adkisson et al. | 257/443 |
| 2007/0023799 | A1 * | 2/2007 | Boettiger | 257/292 |
| 2007/0262354 | A1 | 11/2007 | Hsu et al. | |
| 2010/0038523 | A1 | 2/2010 | Venezia et al. | |
| 2010/0038740 | A1 | 2/2010 | Fereyre | |
| 2010/0060758 | A1 * | 3/2010 | Oshiyama et al. | 348/294 |
| 2013/0200251 | A1 * | 8/2013 | Velichko | 250/208.1 |

(Continued)

FOREIGN PATENT DOCUMENTS

| CA | 2788714 | 12/2011 |
|---|---|---|
| CN | 101753863 | 6/2010 |

(Continued)

OTHER PUBLICATIONS

Compton, Color Filter Array 2.0, Jun. 14, 2007, http://johncompton.1000nerds.kodak.com/default.asp?item=624876, Captured on Jul. 20, 2007.

*Primary Examiner* — Wael Fahmy
*Assistant Examiner* — Sarah Salerno
(74) *Attorney, Agent, or Firm* — Slater Matsil, LLP

(57) ABSTRACT

Various structures of image sensors are disclosed, as well as methods of forming the image sensors. According to an embodiment, a structure comprises a substrate comprising photo diodes, an oxide layer on the substrate, recesses in the oxide layer and corresponding to the photo diodes, a reflective guide material on a sidewall of each of the recesses, and color filters each being disposed in a respective one of the recesses. The oxide layer and the reflective guide material form a grid among the color filters, and at least a portion of the oxide layer and a portion of the reflective guide material are disposed between neighboring color filters.

20 Claims, 21 Drawing Sheets

(56) References Cited

U.S. PATENT DOCUMENTS

2013/0307107 A1 11/2013 Tsai et al.
2015/0241611 A1 8/2015 Hirota

FOREIGN PATENT DOCUMENTS

KR 1020070109895 11/2007
WO 2010074708 7/2010

* cited by examiner

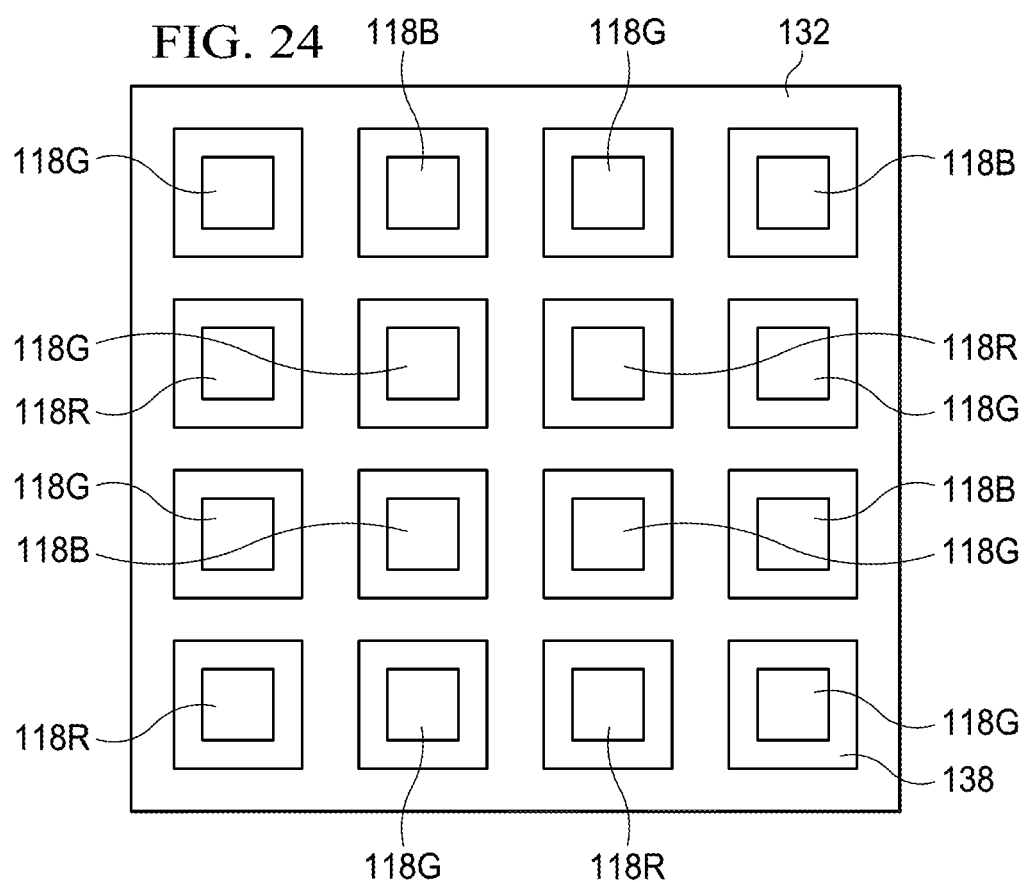

IMAGE SENSOR COMPRISING REFLECTIVE GUIDE LAYER AND METHOD OF FORMING THE SAME

CROSS-REFERENCE TO RELATED APPLICATIONS

This application relates to the following co-pending and commonly assigned patent application: U.S. application Ser. No. 13/592,124, filed Aug. 22, 2012, entitled "BSI Image Sensor Chips with Separated Color Filters and Methods for Forming the Same," which application is hereby incorporated herein by reference in its entirety.

BACKGROUND

As technologies evolve, complementary metal-oxide semiconductor (CMOS) image sensors are gaining in popularity over traditional charged-coupled devices (CCDs) due to certain advantages inherent in the CMOS image sensors. In particular, a CMOS image sensor may have a high image acquisition rate, a lower operating voltage, lower power consumption and higher noise immunity. In addition, CMOS image sensors may be fabricated on the same high volume wafer processing lines as logic and memory devices. As a result, a CMOS image chip may comprise both image sensors and any necessary logic, such as amplifiers, A/D converters, or the like.

CMOS image sensors generally are pixelated metal oxide semiconductors. A CMOS image sensor typically comprises an array of light sensitive picture elements (pixels), each of which may include transistors, capacitors, and a photo-sensitive element. A CMOS image sensor utilizes light-sensitive CMOS circuitry to convert photons into electrons. The light-sensitive CMOS circuitry typically comprises a photo diode formed in a substrate. As the photo diode is exposed to light, electrical charges are induced in the photo diode. Each pixel may generate electrons proportional to the amount of light that falls on the pixel when light is incident on the pixel from a subject scene. Furthermore, the electrons are converted into a voltage signal in the pixel and further transformed into a digital signal by means of an A/D converter. A plurality of periphery circuits may receive the digital signals and process them to display an image of the subject scene.

A CMOS image sensor may comprise a plurality of additional layers, such as dielectric layers and interconnect metal layers, formed on top of the substrate, wherein the interconnect layers are used to couple the photo diode with peripheral circuitry. The side having additional layers of the CMOS image sensor is commonly referred to as a front side, while the side having the substrate is referred to as a backside. Depending on the light path difference, CMOS image sensors can be further divided into two major categories, namely front side illuminated (FSI) image sensors and backside illuminated (BSI) image sensors.

BRIEF DESCRIPTION OF THE DRAWINGS

For a more complete understanding of the present disclosure, and the advantages thereof, reference is now made to the following descriptions taken in conjunction with the accompanying drawings, in which:

FIGS. 21 through 24 are intermediate structures in a fourth method of forming a reflective guide layer of a BSI image sensor in accordance with an embodiment.

DETAILED DESCRIPTION OF ILLUSTRATIVE EMBODIMENTS

Figure 1:
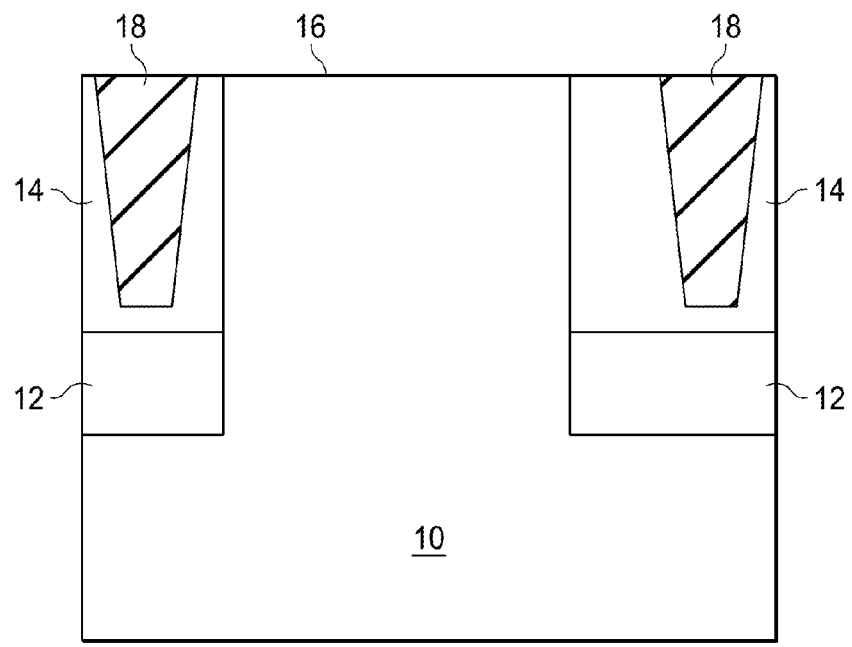
FIGS. 1 through 4 are cross sectional views of intermediate structures in a method of forming a pixel of a BSI image sensor in accordance with an embodiment.

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the embodiments of the disclosure, and do not limit the scope of the disclosure.

The present disclosure describes embodiments in a specific context, namely a backside illuminated image (BSI) sensor. Other embodiments may also be applied, however, to a variety of image sensors, such as a front side illuminated (FSI) image sensor or the like. Hereinafter, various embodiments will be explained in detail with reference to the accompanying drawings. Although various steps of a disclosed method may be discussed in a particular order, other methods may be performed in any logical order. Like reference characters in the figures refer to like components.

FIGS. 1 through 4 illustrate a process to form an example pixel of an image sensor array. As discussed below, the pixel comprises a photo diode 100. Multiple pixels are typically formed in and/or on a substrate 10 simultaneously to form the image sensor array. FIGS. 5 through 24 more simply show multiple photo diodes 100 in the array in a substrate 10, although a person having ordinary skill in the art will understand that each photo diode 100 in FIGS. 5 through 24 may be formed simultaneously as shown in FIGS. 1 through 4.

FIG. 1 illustrates a cross sectional view of a substrate 10 of a pixel of an image sensor during processing. The substrate 10 includes a lightly p-type doped epitaxial layer over a highly p-type doped silicon substrate, for example. In other embodiments, the substrate 10 may include silicon, germanium, silicon germanium, graded silicon germanium, carbon, quartz, sapphire, glass, a bulk semiconductor material, a semiconductor-on-insulator, or the like, and may be multi-layered (e.g., comprising strained layers) and/or doped such as by an n-type dopant. A deep p-well (DPW) region 12 is formed in the substrate 10, and a cell p-well (CPW) region 14 is formed over the DPW region 12 in the substrate 10. The DPW region 12 and the CPW region 14 are components of an isolation region formed in the substrate 10 to prevent cross-talk between adjacent pixels. The DPW region 12 and CPW region 14 are formed by, for example, implanting p-type dopants, such as boron or the like, through a front side 16 of the substrate 10. In an embodiment, a p-type doping concentration of the CPW region 14 is greater than a p-type doping concentration of the DPW region 12. The DPW region 12 can have a doping concentration in a range from about $10^{13}/cm^3$ to about $10^{18}/cm^3$. The CPW region 14 can have a doping concentration in a range from about $10^{15}/cm^3$ to about $10^{19}/cm^3$.

A trench is etched in the CPW region 14 in the substrate 10. The etching process may be performed using acceptable photolithography and etching techniques. A dielectric material 18, such as an oxide, is deposited in the trench. The dielectric material 18 can be deposited by a high density plasma chemical vapor deposition (HDP-CVD), plasma enhanced chemical vapor deposition (PECVD), a thermal CVD, the like, or a combination thereof. Further, the dielectric material 18 can be any dielectric material formed by an acceptable process. A planarization, such as by a chemical mechanical polish (CMP), may be performed on the front side 16 after the deposition of the dielectric material 18. FIG. 1 illustrates the formed isolation regions, including the DPW region 12, CPW region 14, and dielectric material 18 formed in the substrate 10.

Figure 2:
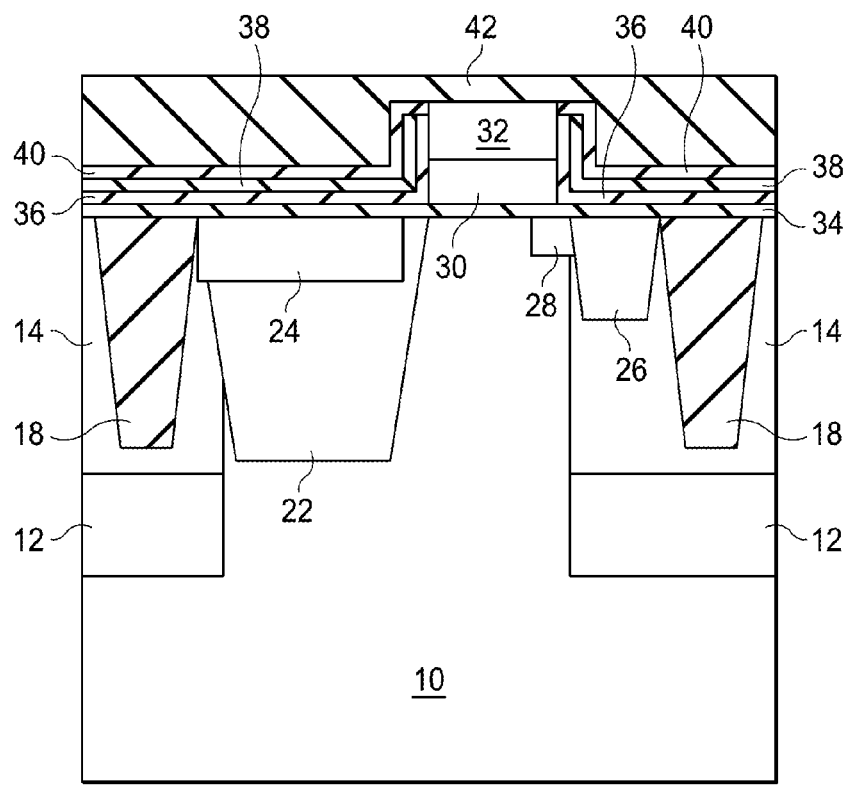

FIG. 2 is a cross sectional view of the substrate 10 after further processing according to an embodiment. A photo diode is formed in the substrate 10. The photo diode comprises an n-type region 22 and a p-type region 24 that form a p-n junction. The n-type region 22 has an n-type dopant concentration of, for example, between about $10^{15}/cm^3$ and about $10^{19}/cm^3$, and the p-type region 24 has a p-type dopant concentration of, for example, between about $10^{16}/cm^3$ and about $10^{20}/cm^3$. The photo diode is formed proximate one of the isolation regions. A source/drain region 26 is formed in the substrate 10 in the CPW region 14 of the other illustrated isolation region. The source/drain region 26 in this example is an n-type region having an n-type dopant concentration of, for example, between about $10^{16}/cm^3$ and about $10^{20}/cm^3$. An extension region 28 extends from the source/drain region 26, and has an n-type dopant concentration of, for example, between about $10^{18}/cm^3$ and about $10^{22}/cm^3$. These regions 22, 24, 26, and 28 can be formed by appropriate implantation through the front side 16.

A gate dielectric layer 34 is formed on the front side 16 over the substrate 10. A gate electrode layer, such as polysilicon or the like, is deposited over the gate dielectric layer 34 and patterned into a gate electrode 30. The gate electrode 30 comprises an n-type doped upper region 32 formed by implantation, in situ doping during deposition, or the like, and has an n-type dopant concentration, for example, between about $10^{7}/cm^3$ and about $10^{14}/cm^3$. The gate electrode 30 is laterally between the photo diode and the source/drain region 26, and partially over the extension region 28. A dielectric layer 36, such as tetraethyl orthosilicate (TEOS) or the like, is conformally deposited over the substrate 10 and the gate electrode 30, and a resist protective layer (RPL) 38, such as silicon oxide or the like, is conformally deposited over the dielectric layer 36. The dielectric layer 36 and RPL 38 can be etched to expose a top surface of the gate electrode 30 and are recessed below the top surface of the gate electrode 30. An etch stop layer (ESL) 40, such as silicon nitride or the like, is conformally deposited over the RPL 38. An inter-layer dielectric (ILD) 42, such as silicon oxide, borophosphosilicate glass (BPSG), phosphosilicate glass (PSG), fluorinated silicate glass (FSG), carbon-doped silicon oxide, or the like, is deposited over the ESL 40. The ILD 42 can be planarized using, for example, a CMP. These components can be formed with any acceptable deposition process using any acceptable material.

Contacts (not explicitly illustrated) can be formed through the ILD 42 to the substrate 10. For example, openings can be etched using acceptable photolithography and etching techniques, and conductive materials, such as a copper, aluminum, or the like, with or without a barrier layer, can be deposited into the openings. A polishing and/or grinding process, such as a CMP, can remove excess conductive materials and leave the contacts in the openings.

Figure 3:
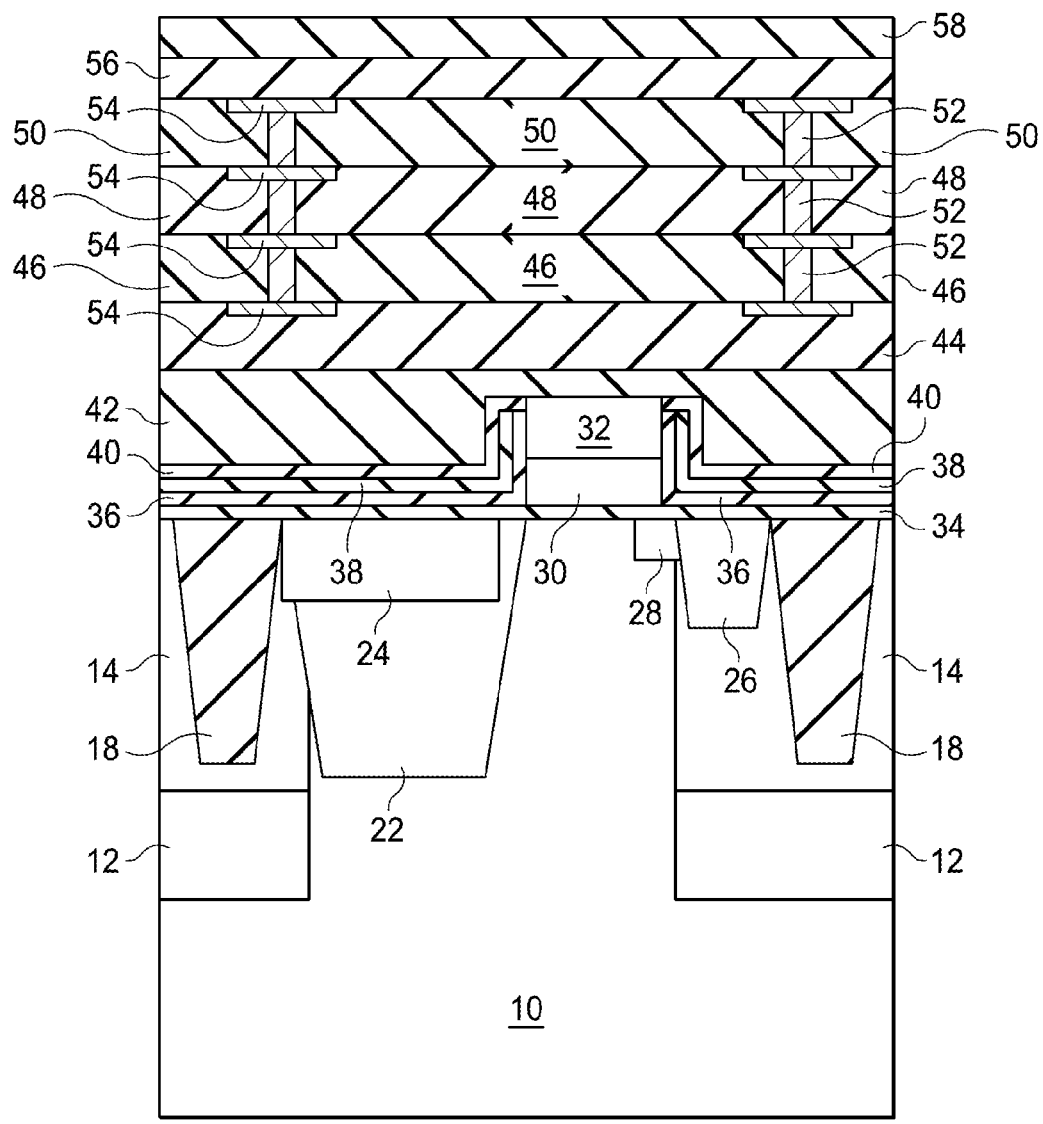

As shown in the cross sectional view of FIG. 3, subsequent inter-metal dielectrics (IMDs) 44, 46, 48, and 50 having metallization patterns 54 and vias 52 are formed over the ILD 42. Each of the IMDs 44, 46, 48, and 50 can be silicon oxide, BPSG, PSG, FSG, the like, or a combination thereof, formed by CVD, HDP-CVD, furnace deposition, PECVD, the like, or a combination thereof. The vias 52 and metallization patterns 54 in each of the IMDs 44, 46, 48, and 50 can be formed using, for example, a damascene process like a dual damascene. Conductive materials, such as aluminum, copper, or the like, with or without a barrier layer, can be used as the vias 52 and metallization patterns 54 and can be deposited using, for example, CVD, atomic layer deposition (ALD), physical vapor deposition (PVD), the like, or a combination thereof. A polishing and/or grinding process, such as a CMP, can remove excess conductive materials. The IMDs 44, 46, 48, and 50 are sequentially formed, along with the respective vias 52 and metallization patterns 54.

A first passivation layer 56 is formed over the top IMD 50, and a second passivation layer 58 is formed over the first passivation layer 56. The passivation layers 56 and 58 can be silicon nitride, silicon carbide, silicon oxide, the like, or a combination thereof, deposited by CVD or the like. It should be noted that many other components may be included in an embodiment that are not expressly depicted. For example, etch stop layers can be disposed between the various interfaces between layers of the ILD 42 and IMDs 44, 46, 48, and 50. Further, more or fewer IMDs can be used.

Figure 4:
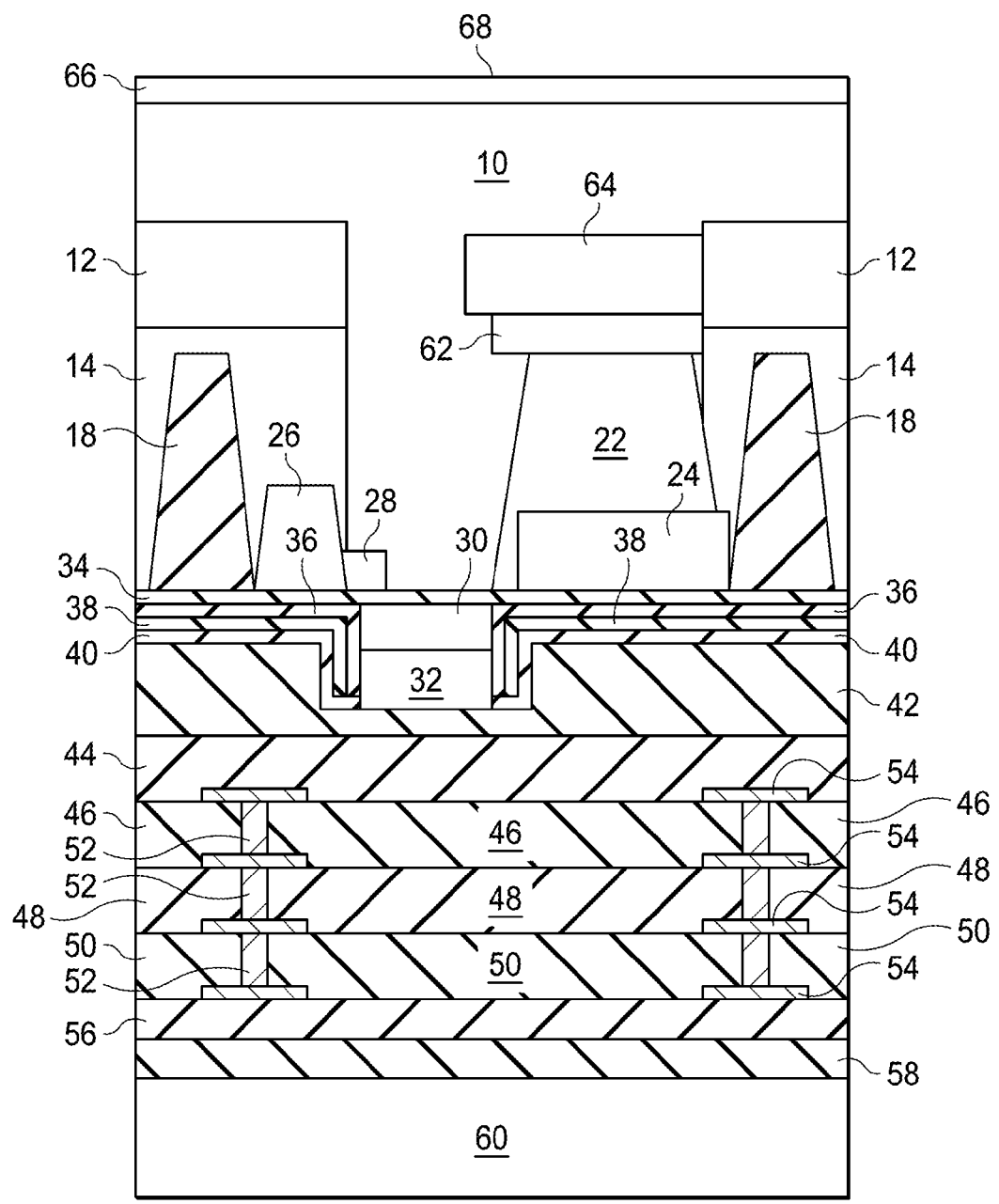

FIG. 4 is a cross sectional view after the substrate 10 is flipped and bonded on a carrier 60. Once the passivation layers 56 and 58 are formed, the substrate 10 is flipped and bonded on the carrier 60, which may be silicon, glass, or the like. In particular, the front side 16 of the substrate 10 faces toward the carrier 60. Various bonding techniques may be employed to achieve bonding between front side 16 of the substrate 10, e.g., the second passivation layer 58, and the carrier 60. Suitable bonding techniques may include adhesive bonding, vacuum bonding, anodic bonding, or the like. The carrier 60 may provide sufficient mechanical support to resist forces due to a grinding step of a thinning process.

A thinning process is performed on a backside of the substrate 10. The substrate 10 is thinned until the lightly doped p-type epitaxial layer of the substrate 10 is exposed from the backside 68 of the substrate 10. A thin substrate 10 allows more light to pass through the substrate 10 and hit photo diodes embedded in the substrate 10 without being absorbed by the substrate 10. The thinning process may be implemented by using suitable techniques, such as grinding, polishing and/or chemical etching.

Deep n-type regions 62 and 64 are formed in the substrate 10 by an ion implantation into the substrate 10 through the backside 68 of the substrate 10. The deep n-type region 62 is disposed between the deep n-type region 64 and the n-type region 22 of the photo diode. The deep n-type region 62 can have a doping concentration in a range from about $10^{15}/cm^3$ to about $10^{18}/cm^3$. The deep n-type region 64 can have a doping concentration in a range from about $10^{14}/cm^3$ to about $10^{17}/cm^3$. As a result, an extended photo active region is formed.

A thin p+ layer 66 is formed on the backside 68 of the substrate 10. The thin p+ layer 66 is formed by an ion implantation through the backside 68 of the substrate 10, and has a p-type dopant concentration from about $10^{17}/cm^3$ to about $10^{22}/cm^3$. The thin p+ layer 66 may be formed on the backside 68 of the substrate 10 to increase the number of photons converted into electrons. In order to repair crystal defects that can be caused by ion implantation and to activate the implanted ions, a laser annealing process may be performed on the backside 68 of the substrate 10.

At this point in this disclosure, the substrate 10 will be described at a simplified level, and will be illustrated as comprising an array of photo diodes 100. A person of ordinary skill in the art will readily understand that each of the photo diodes 100 may comprise the p-n junction formed by n-type region 22 and p-type region 24 shown in FIG. 4, and that each of the photo diodes 100 may be separated from neighboring photo diodes 100 by an isolation region comprising the DPW region 12, CPW region 14, and dielectric material 18. Further, an interconnect block 102, which may comprise the ILD 42, IMDs 44, 46, 48, and 50, vias 52, metallization patterns 54, and passivation layers 56 and 58, is formed across the array as shown in FIG. 5.

Figure 5:
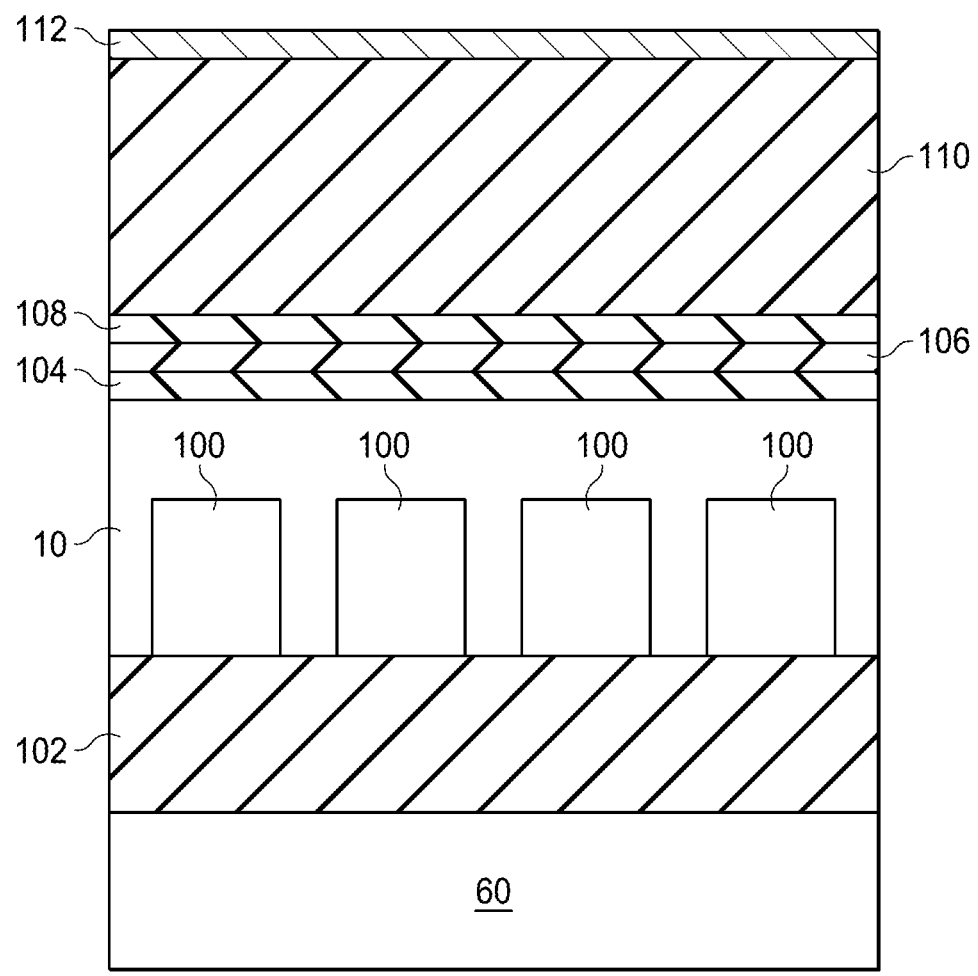
FIGS. 5 through 10 are intermediate structures in a first method of forming a reflective guide layer of a BSI image sensor in accordance with an embodiment.

FIGS. 5 through 10 illustrate various intermediate structures in a process according to an embodiment. In FIG. 5, an anti-reflection coating (ARC) structure is formed on the backside 68 of the substrate 10. In the illustrated embodiment, the ARC structure comprises a three-layered structure, although fewer or more layers may be used. In this embodiment, the ARC structure comprises a silicon oxide layer 104, a hafnium oxide ($HfO_2$) layer 106 over the silicon oxide layer 104, and a tantalum oxide ($Ta_2O_5$) layer 108 over the hafnium oxide layer 106. These layers may be formed by any acceptable process, such as CVD or the like. In an embodiment, the silicon oxide layer 104 has a thickness between greater than about 0 Å and less than or equal to about 100 Å, such as 20 Å; the hafnium oxide layer 106 has a thickness between greater than about 30 Å and about 150 Å, such as 60 Å; and the tantalum oxide layer 108 has a thickness between about 300 Å and about 800 Å, such as 500 Å. In other embodiments, the ARC structure may be any number of layers comprising any acceptable thickness and any acceptable material(s) formed by a suitable process.

A silicon oxide layer 110 is formed over the ARC structure. In an embodiment, the silicon oxide layer 110 may be formed using PECVD, and hence may be referred to as Plasma Enhanced (PE) silicon oxide layer 110. The silicon oxide layer 110 has a thickness between about 3,000 Å and about 15,000 Å, such as 8,000 Å. Other embodiments may include other acceptable materials with an acceptable thickness and formed by a suitable process.

A hardmask layer 112 is formed over the silicon oxide layer 110. The hardmask layer 112 may be a metal or a high refractive index material, and may be formed by any acceptable process, such as using CVD, diffusion, the like, or a combination thereof. For example, the hardmask layer 112 may comprise copper, aluminum, tantalum nitride, titanium nitride, tungsten, silicon nitride, other high refractive index material, or a combination thereof. A high refractive index material may have a refractive index greater than 2.0. The hardmask layer 112 can have a thickness between about 100 Å and about 2,000 Å, such as about 1,500 Å.

Figure 6:
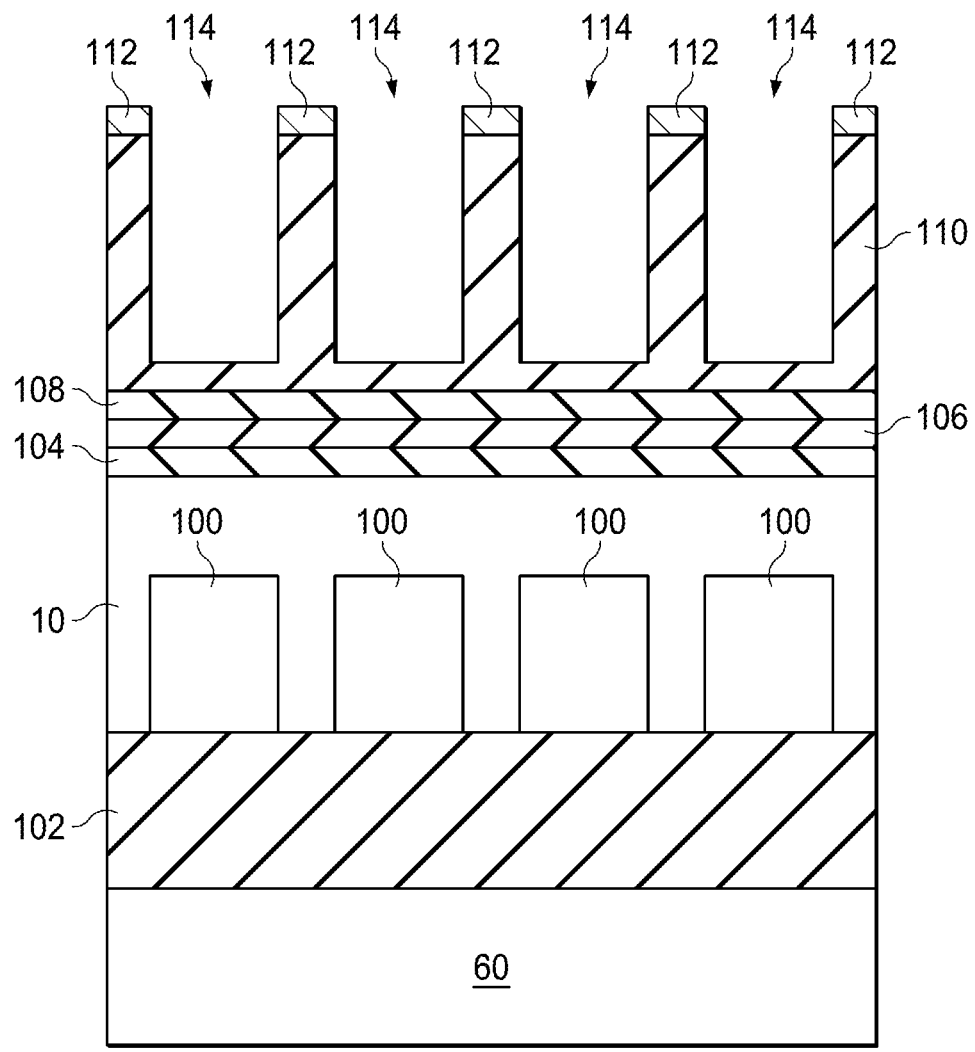

In FIG. 6, an array of recesses 114 is formed through the hardmask layer 112 and into the silicon oxide layer 110. Each of the recesses 114 corresponds to a photo diode 100, and hence, the recesses 114 are formed in an array that corresponds to the array of photo diodes 100. The recesses 114 are formed using an acceptable photolithography and etching process, such a reactive ion etching (RIE), inductively coupled plasma (ICP), capacitively coupled plasma (CCP), sputter etch, the like, or a combination thereof. The recesses 114 may have a depth in the silicon oxide layer 110 between about 5,000 Å and about 10,000 Å, such as about 7,500 Å.

Figure 7:
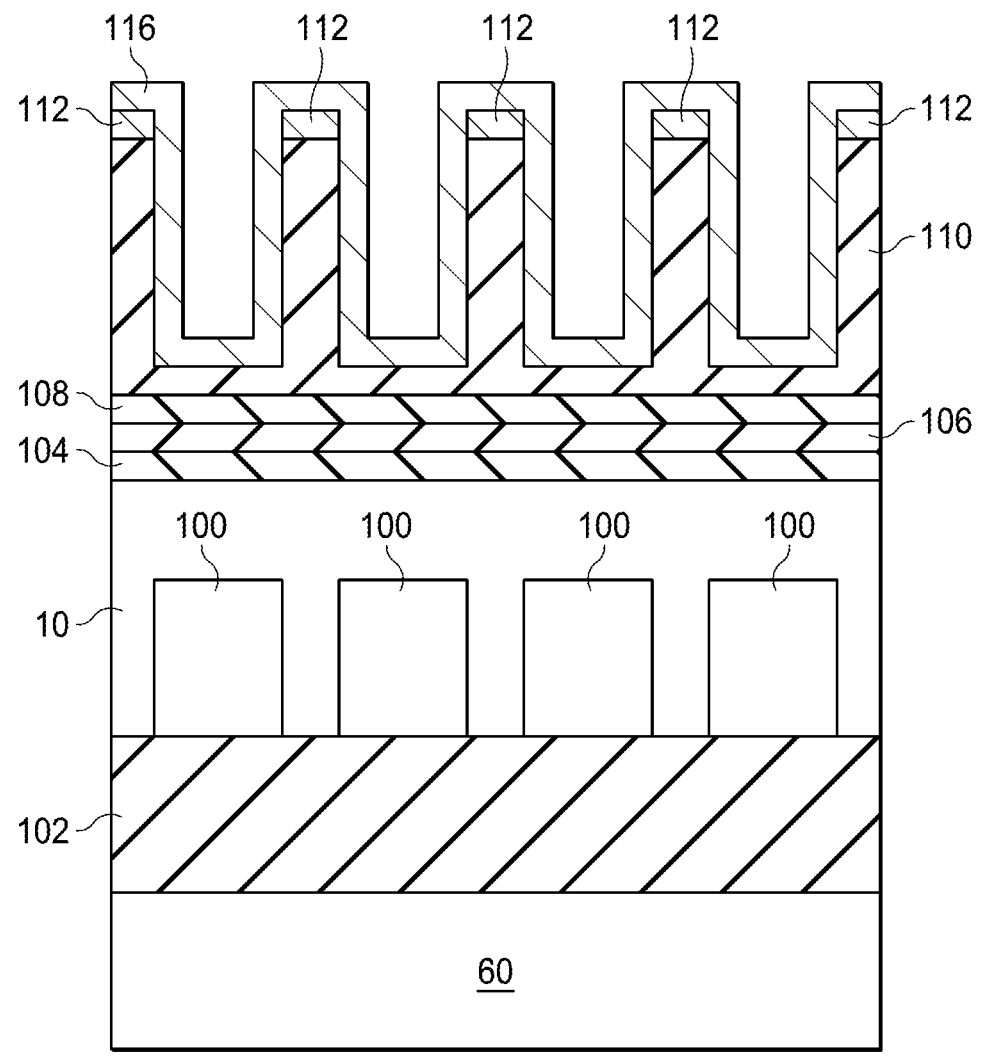

FIG. 7 illustrates a reflective guide layer 116 formed on the silicon oxide layer 110 and hardmask layer 112 and in the recesses 114. The reflective guide layer 116 is conformally formed on the silicon oxide layer 110 and the hardmask layer 112 and in the recesses 114, such as along the sidewalls and bottom surfaces of the recesses 114. The reflective guide layer 116 in this embodiment is a metal or other high refractive index material that is capable of reflecting light, such as copper, aluminum, tantalum nitride, titanium nitride, tungsten, silicon nitride, the like, or a combination thereof. The reflective guide layer 116 may be formed using CVD, PVD, ALD, the like or a combination thereof, and may have a thickness between about 10 Å and about 2,000 Å, such as about 1,000 Å.

Figure 8:
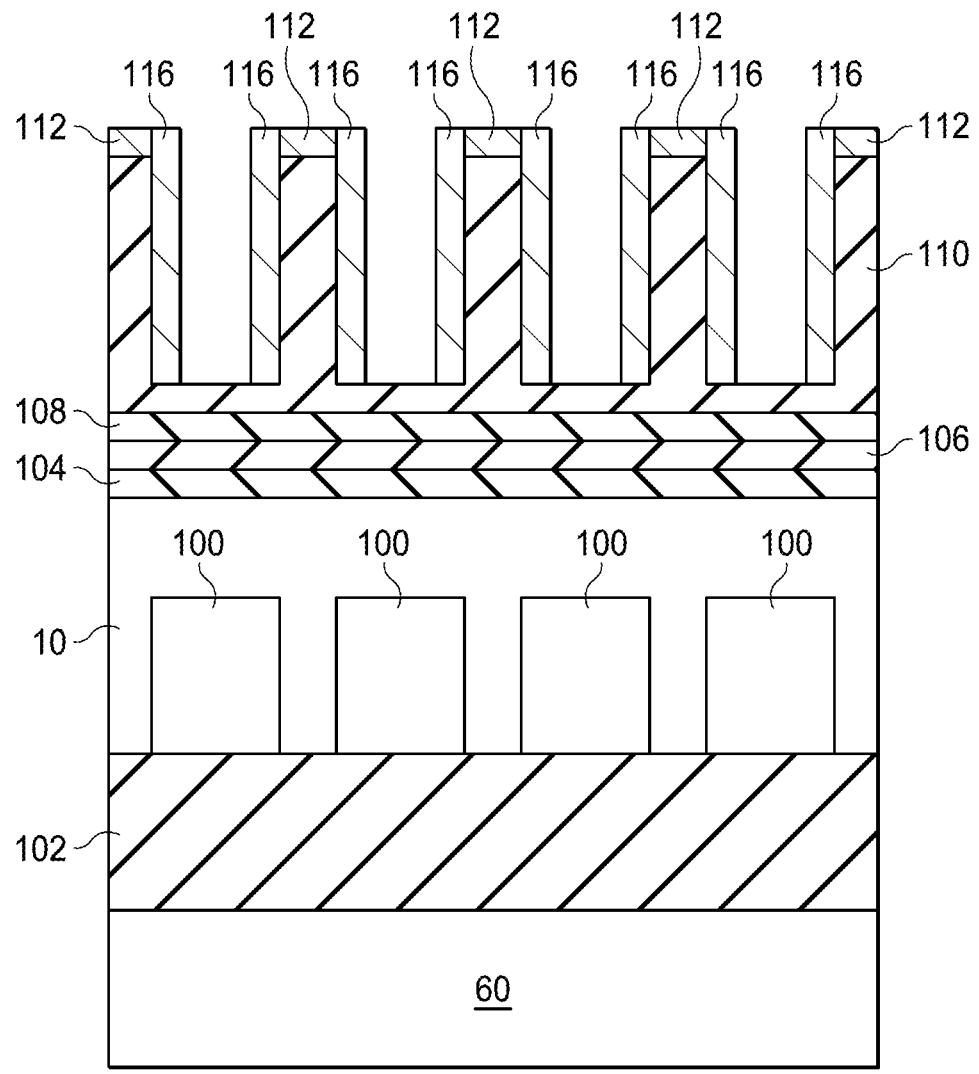

In FIG. 8, the reflective guide layer 116 is anisotropically etched such that portions of the reflective guide layer 116 along sidewalls of the recesses 114 remain, while portions of the reflective guide layer 116 on bottom surfaces of the recesses 114 and top surfaces of the hardmask layer 112 are removed. In other embodiments, portions of the reflective guide layer 116 may remain over the hardmask layer 112, such as when using a photolithography process with the etch. The etch can be any acceptable etching process, such as RIE, ICP, CCP, sputter etch, the like, or a combination thereof.

Figure 9:
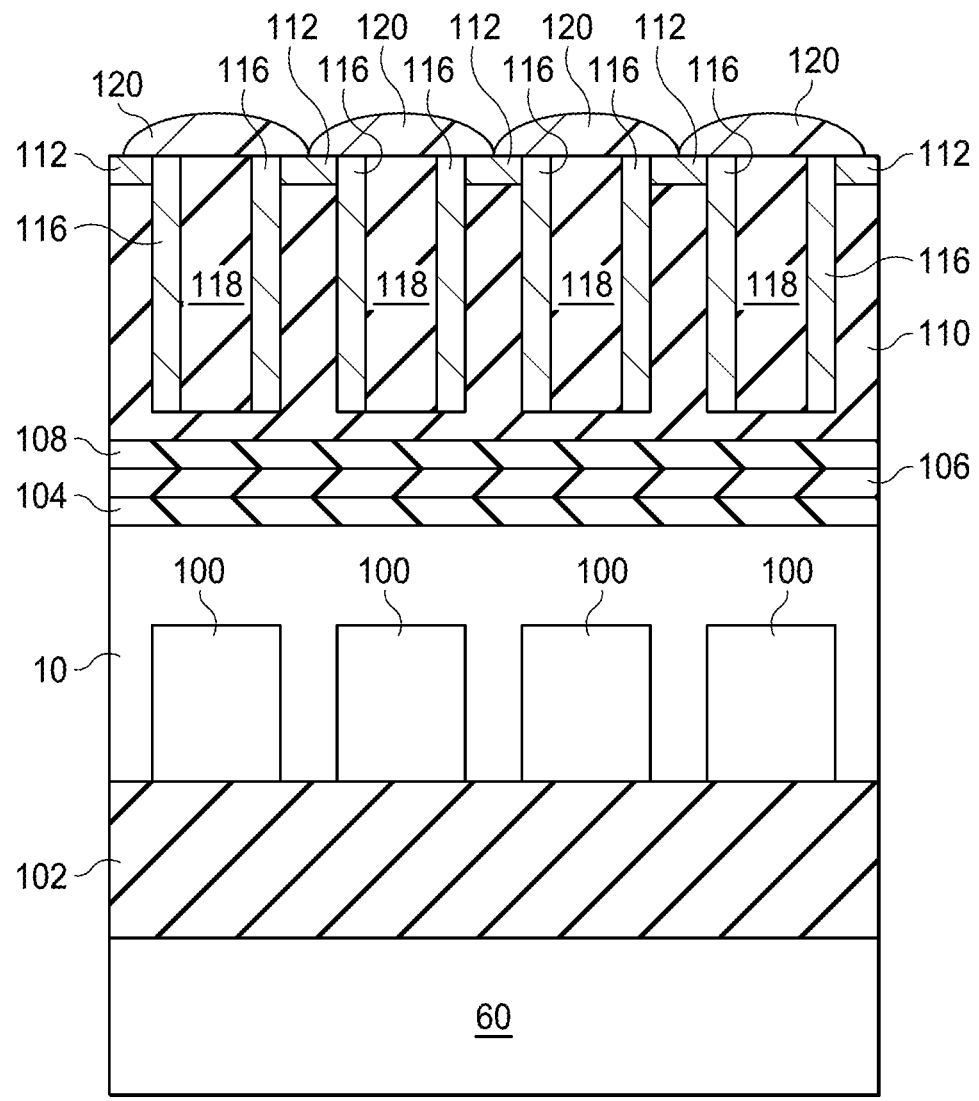

In FIG. 9, color filters 118 are formed in the recesses 114. The color filters 118 may be used to allow specific wavelengths of light to pass while reflecting other wavelengths, thereby allowing the image sensor to determine the color of the light being received by the photo diodes 100. The color filters 118 may vary, such as being a red, green, and blue filter as used in a Bayer pattern. Other combinations, such as cyan, yellow, and magenta, may also be used. The number of different colors of the color filters 118 may also vary.

The color filters 118 may comprise a polymeric material or resin, such as a polymeric polymer, polymethyl-methacrylate (PMMA), polyglycidylmethacrylate (PGMS), or the like, that includes colored pigments. In an embodiment, a polymeric polymer material with a first color pigment, e.g., a red pigment, may be formed in the recesses 114 using a process such as spin coating or the like. The polymeric polymer material with the first color pigment in recesses 114 in which that color pigment is not desirable may be removed by using a suitable photolithographic masking and etching process. For example, a photoresist can be patterned to cover the desired portions of the polymeric polymer material with the first color pigment, and the exposed portions of the polymeric polymer material with the first color pigment may be removed using an anisotropic etch.

Then, a polymeric polymer material with a second color pigment, e.g., a blue pigment, may be formed in the unfilled recesses 114 using a process such as spin coating or the like. The polymeric polymer material with the second color pigment in recesses in which that color pigment is not desirable may be removed by using a suitable photolithographic masking and etching process. For example, a photoresist can be patterned to cover the desired portions of the polymeric polymer material with the second color pigment as well as the previously formed polymeric polymer material with the first color pigment, and the exposed portions of the polymeric polymer material with the second color pigment may be removed using an anisotropic etch.

Subsequently, a polymeric polymer material with a third color pigment, e.g., a green pigment, may be formed in the unfilled recesses 114 using a process such as spin coating. If, for example, a Bayer pattern is used, all of the recesses 114 may be desirably filled after forming the polymeric polymer material with the third pigment. Any excess polymeric polymer material, such as above the top surface of the hardmask layer 112 and/or the reflective guide layer 116, may be removed using a planarization process, such as a CMP or the like. If all of the recesses are not desirably filled after this step, previous steps may be repeated until all of the recesses are desirably filled, as would be recognized by a person of ordinary skill in the art. In other embodiments, the color filters 118 may be formed by any suitable method with any suitable materials.

Microlenses 120 are formed over the color filters 118. The microlenses 120 may be formed of any material that may be patterned and formed into lenses, such as a high transmittance, acrylic polymer. In an embodiment, a microlens layer may be formed using a material in a liquid state and spin-on techniques. This method has been found to produce a substantially planar surface and a microlens layer having a substantially uniform thickness, thereby providing greater uniformity in the microlenses 120. Other methods, such as deposition techniques like CVD, PVD, or the like, may also be used. The planar material for the microlens layer may be patterned using a photolithography and etch technique to pattern the planar material in an array corresponding to the array of photo diodes 100. The planar material may then be reflowed to form an appropriate curved surface for the microlenses 120, and the microlenses 120 can be cured using a UV treatment.

Figure 10:
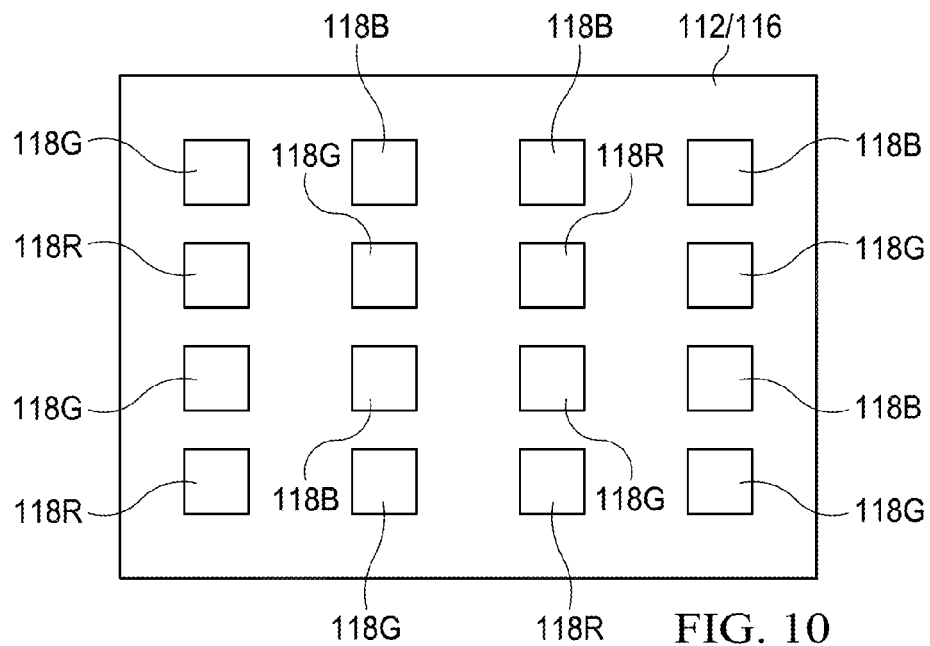

FIG. 10 illustrates a portion of an array of color filters 118 in plan view along the top surfaces of the color filters 118, the hardmask layer 112, and the reflective guide layer 116 that corresponds to a portion of the array of photo diodes 100. The color filters 118 comprise red color filters 118R, blue color filters 118B, and green color filters 118G patterned in a Bayer pattern. The hardmask layer 112 and the reflective guide layer 116 cover the top surfaces and sidewalls of the silicon oxide layer 110 to direct light to the underlying photo diodes 100.

Figure 11:
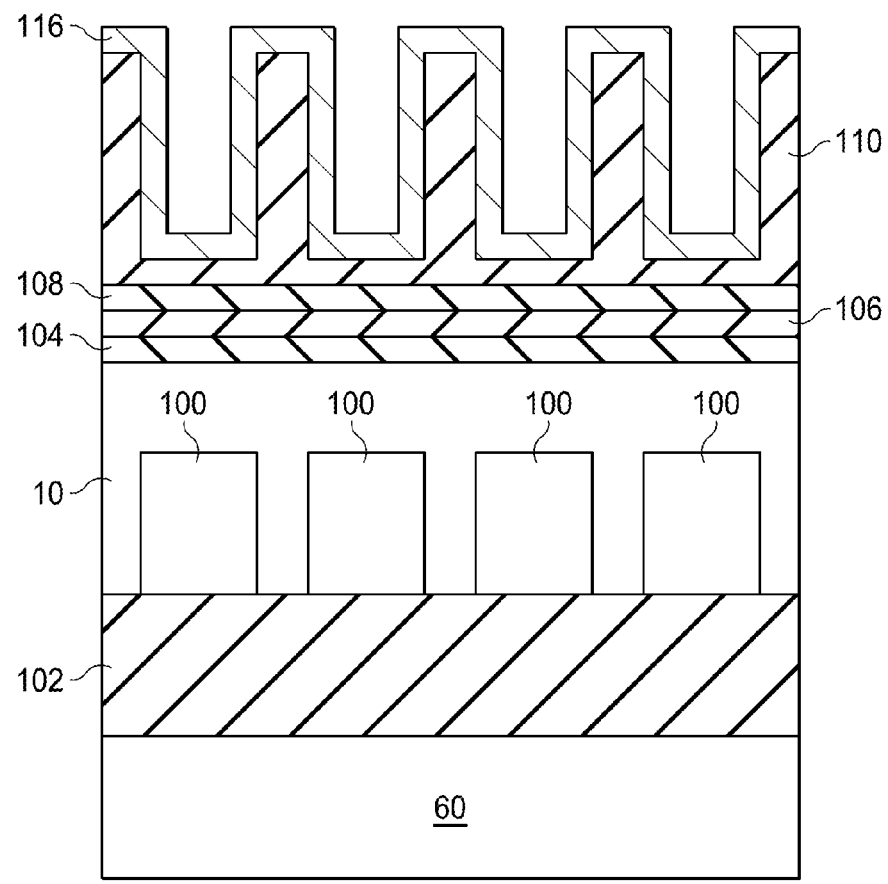
FIGS. 11 through 14 are intermediate structures in a second method of forming a reflective guide layer of a BSI image sensor in accordance with an embodiment.
Figure 12:
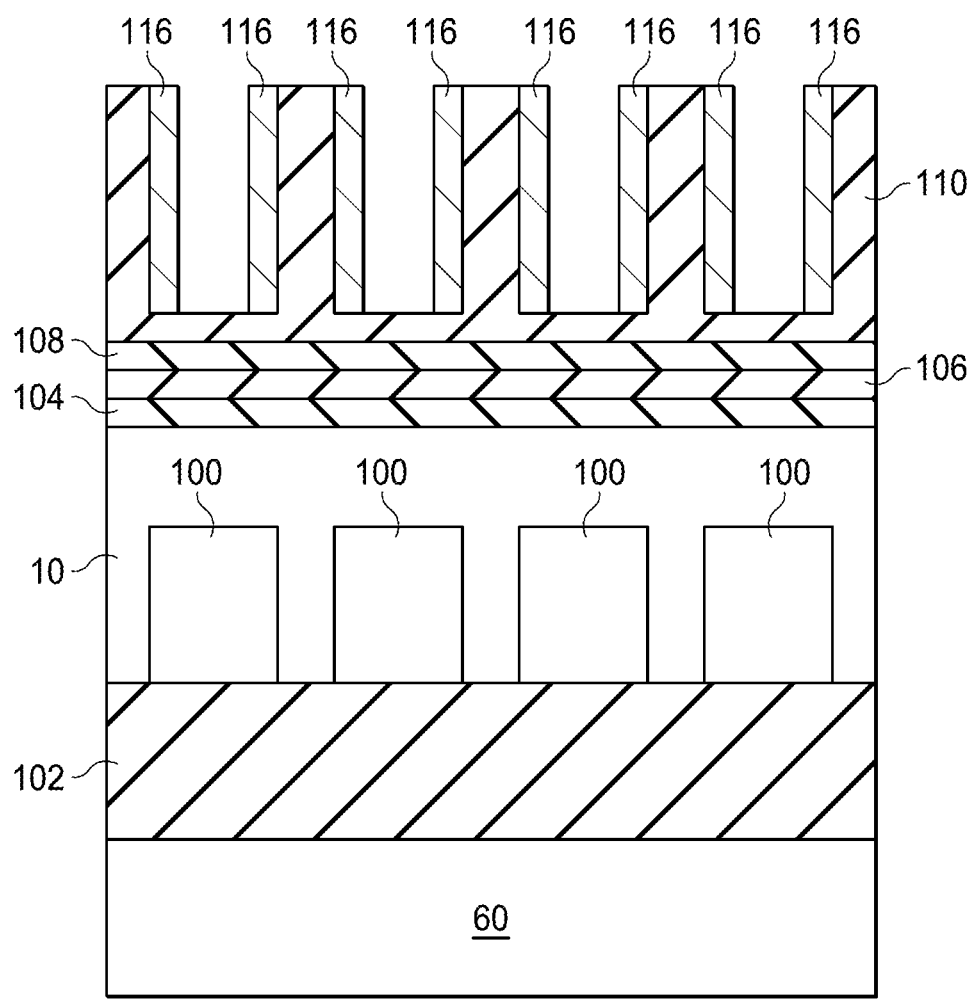
Figure 13:
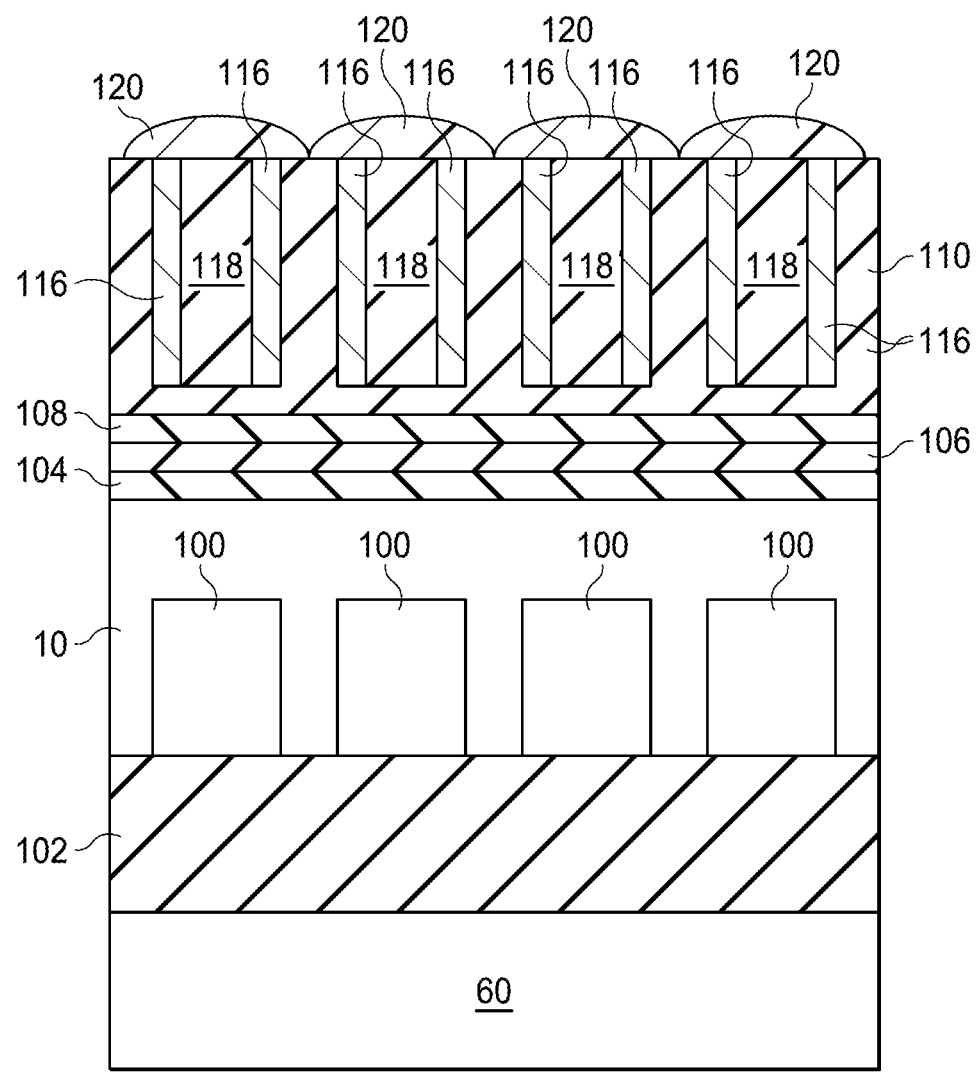

FIGS. 11 through 14 illustrate various intermediate structures during a process according to another embodiment. In FIG. 11, the hardmask layer 112 from the structure of FIG. 6 is removed, and a reflective guide layer 116 is formed on the silicon oxide layer 110 and in the recesses 114 as discussed with respect to FIG. 7. In FIG. 12, the reflective guide layer 116 is anisotropically etched such that portions of the reflective guide layer 116 along sidewalls of the recesses 114 remain, while portions of the reflective guide layer 116 on bottom surfaces of the recesses 114 and top surfaces of the silicon oxide layer 110 are removed, as discussed with respect to FIG. 8. In other embodiments, portions of the reflective guide layer 116 may remain over top surfaces of the silicon oxide layer 110, such as when using a photolithography process with the etch. In FIG. 13, color filters 118 and microlenses 120 are formed, as discussed with respect to FIG. 9.

Figure 14:
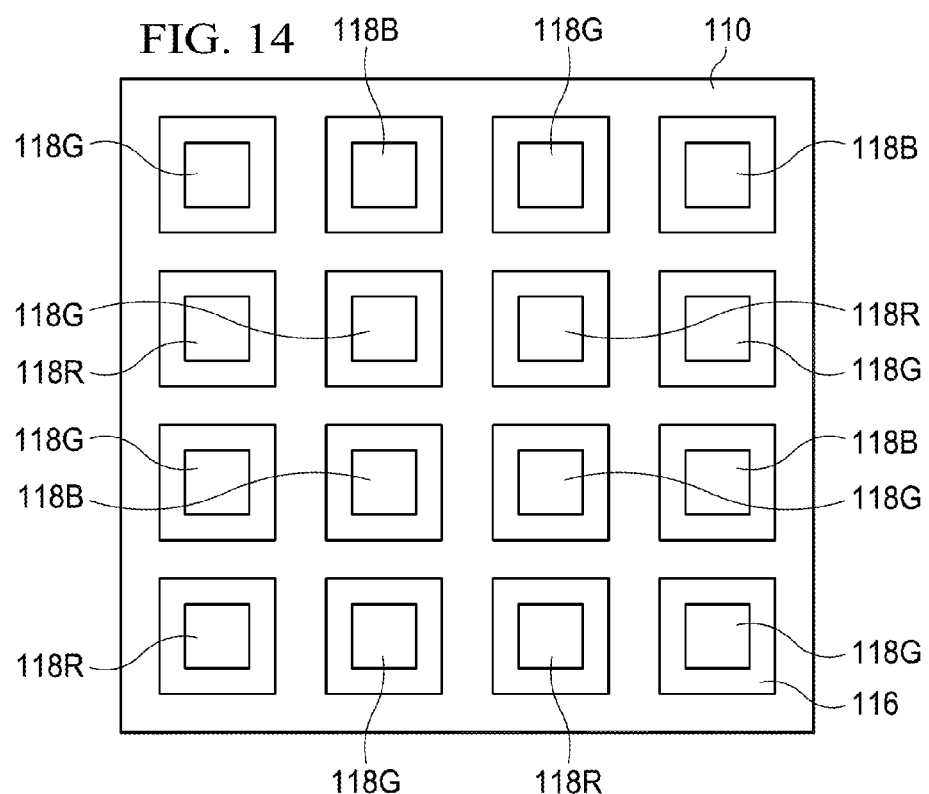

FIG. 14 illustrates a portion of an array of color filters 118 in plan view along the top surfaces of the color filters 118, the silicon oxide layer 110, and the reflective guide layer 116 that corresponds to a portion of the array of photo diodes 100. The color filters 118 comprise red color filters 118R, blue color filters 118B, and green color filters 118G patterned in a Bayer pattern. The reflective guide layer 116 covers the sidewalls of the silicon oxide layer 110 to direct light to the underlying photo diodes 100, and top surfaces of the silicon oxide layer 110 are exposed.

Figure 15:
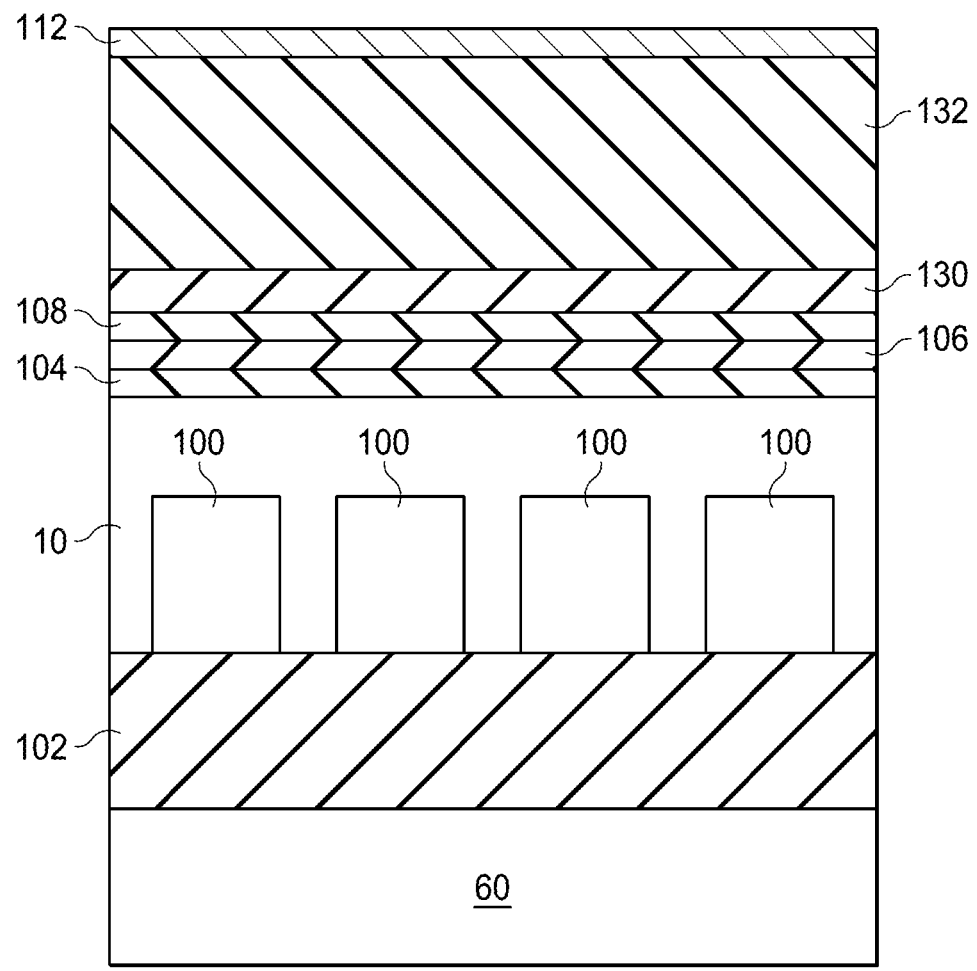
FIGS. 15 through 20 are intermediate structures in a third method of forming a reflective guide layer of a BSI image sensor in accordance with an embodiment.

FIGS. 15 through 20 illustrate various intermediate structures during a process according to a further embodiment. In FIG. 15, an ARC structure is formed on the backside of the substrate 10, and in the illustrated embodiment, the ARC structure comprises a silicon oxide layer 104, a hafnium oxide ($HfO_2$) layer 106 over the silicon oxide layer 104, and a tantalum oxide ($Ta_2O_5$) layer 108 over the hafnium oxide layer 106, as previously discussed with respect to FIG. 5. A silicon nitride layer 130 is formed over the ARC structure, such as over the tantalum oxide layer 108. The silicon nitride layer 130 may be formed using a CVD, PVD, ALD, the like, or a combination thereof, and may have a thickness between about 100 Å and about 3,000 Å, such as about 1,000 Å. A silicon oxide layer 132 is formed over the silicon nitride layer 130. In an embodiment, the silicon oxide layer 132 may be formed using PECVD, and hence may be referred to as PE silicon oxide layer 132. The silicon oxide layer 132 has a thickness between about 2,000 Å and about 10,000 Å, such as 7,500 Å. Other embodiments may include other acceptable materials with any acceptable thickness and formed by any suitable process. A hardmask layer 112 is formed over the silicon oxide layer 132 as discussed with respect to FIG. 5.

Figure 16:
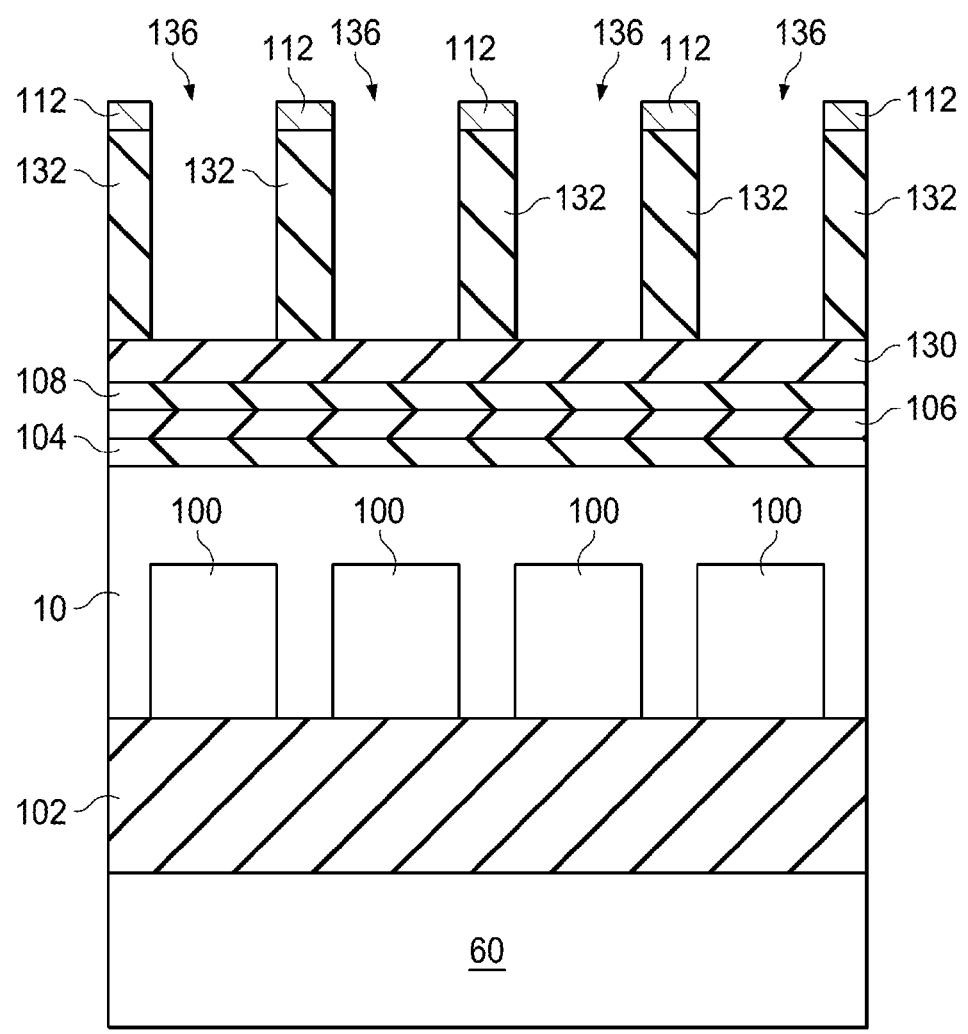

In FIG. 16, an array of recesses 134 is formed through the hardmask layer 112 and into the silicon oxide layer 132. Each of the recesses 134 corresponds to a photo diode 100, and hence, the recesses 134 are formed in an array that corresponds to the array of photo diodes 100. The recesses 134 are formed using an acceptable photolithography and etching process, such a RIE, ICP, CCP, sputter etch, the like, or a combination thereof. The recesses 134 may be etched through the silicon oxide layer 132, and hence, may be openings through the silicon oxide layer 132. In other embodiments, the recesses 134 may extend only partially through the silicon oxide layer 132, while in still further embodiments, the recesses 134 may extend into the silicon nitride layer 130. The recesses 134 may have a depth in the silicon oxide layer 132 and/or silicon nitride layer 130 between about 10 Å and about 2,000 Å, such as about 1,000 Å.

Figure 17:
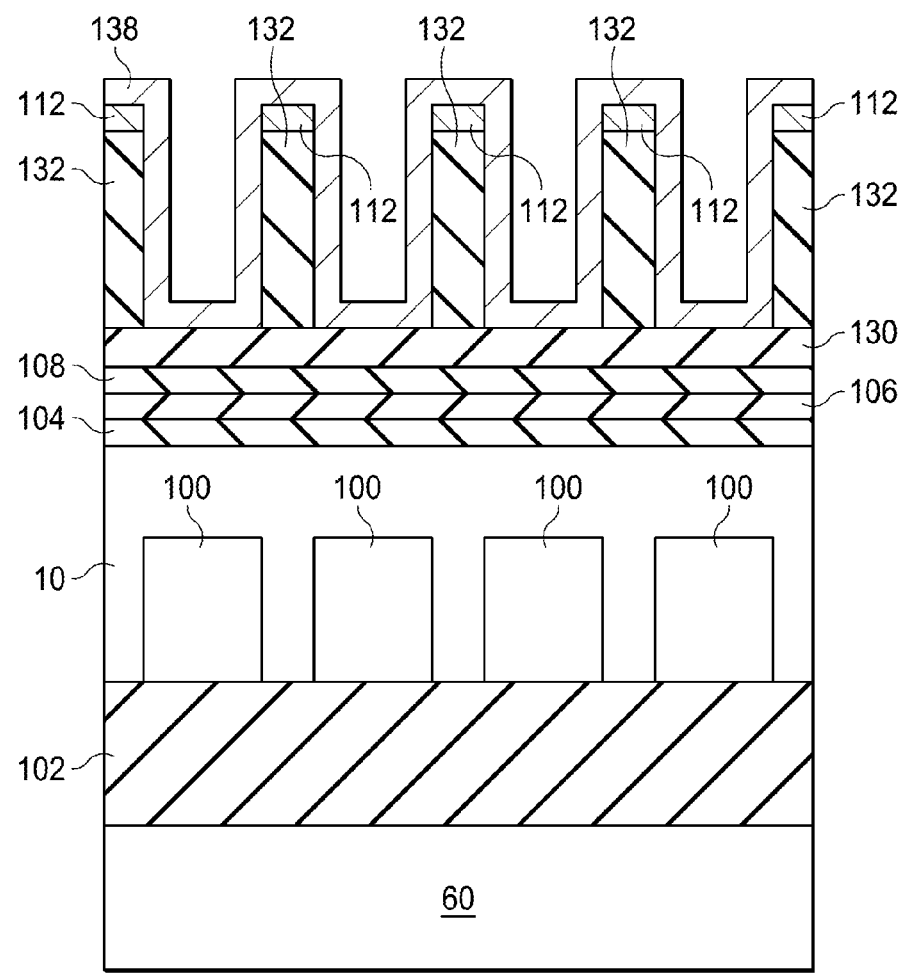

FIG. 17 illustrates a reflective guide layer 136 formed on the silicon oxide layer 132 and hardmask layer 112 and in the recesses 134. The reflective guide layer 136 is conformally formed on the silicon oxide layer 132 and the hardmask layer 112 and in the recesses 134, such as along the sidewalls and bottom surfaces of the recesses 134. The reflective guide layer 136 in this embodiment is a metal or other high refractive index material that is capable of reflecting light, such as copper, aluminum, tantalum nitride, titanium nitride, tungsten, silicon nitride, the like, or a combination thereof. The reflective guide layer 136 may be formed using CVD, PVD, ALD, the like or a combination thereof, and may have a thickness between about 10 Å and about 2,000 Å, such as about 1,000 Å.

Figure 18:
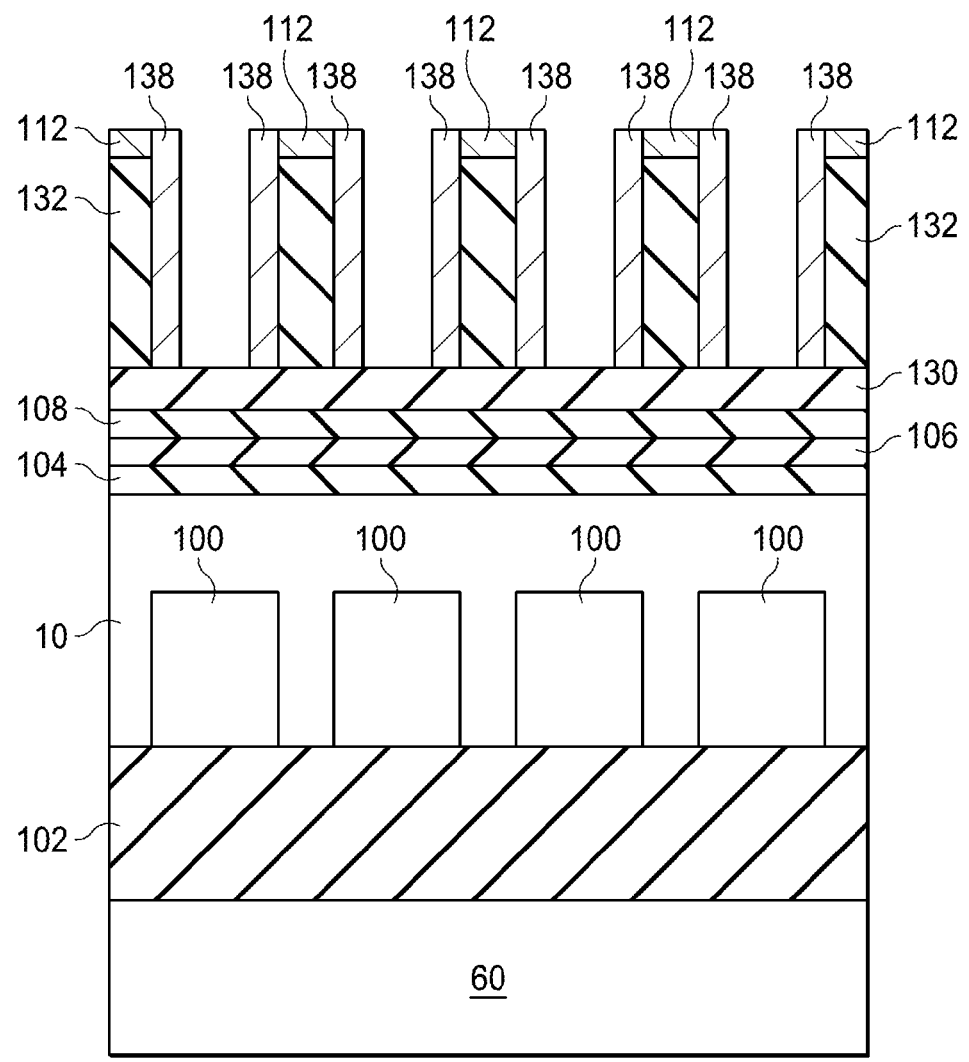
Figure 19:
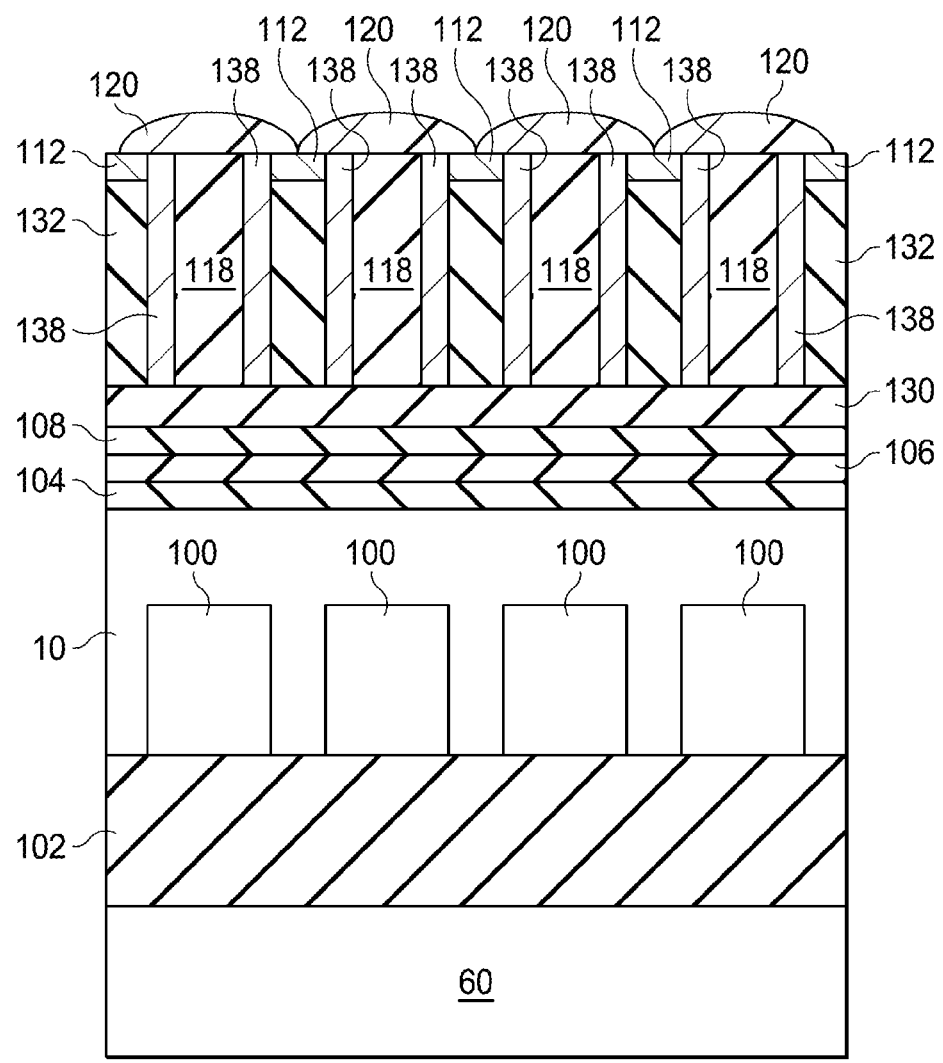

In FIG. 18, the reflective guide layer 136 is anisotropically etched such that portions of the reflective guide layer 136 along sidewalls of the recesses 134 remain, while portions of the reflective guide layer 136 on bottom surfaces of the recesses 134 and top surfaces of the hardmask layer 112 are removed. In other embodiments, portions of the reflective guide layer 136 may remain over the hardmask layer 112, such as when using a photolithography process with the etch. The etch can be any acceptable etching process, such as RIE, ICP, CCP, sputter etch, the like, or a combination thereof. In FIG. 19, color filters 118 are formed in the recesses 134, and microlenses 120 are formed on the color filters 118, as discussed with respect to FIG. 9.

Figure 20:
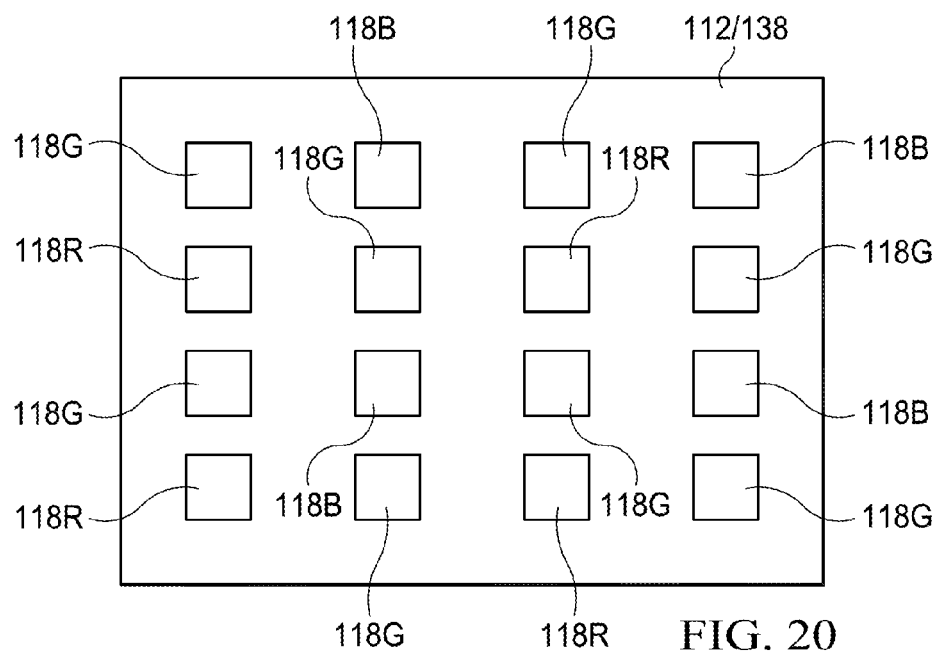

FIG. 20 illustrates a portion of an array of color filters 118 in plan view along the top surfaces of the color filters 118, the hardmask layer 112, and the reflective guide layer 136 that corresponds to a portion of the array of photo diodes 100. The color filters 118 comprise red color filters 118R, blue color filters 118B, and green color filters 118G patterned in a Bayer pattern. The hardmask layer 112 and the reflective guide layer 136 cover the top surfaces and sidewalls of the silicon oxide layer 132 to direct light to the underlying photo diodes 100.

Figure 21:
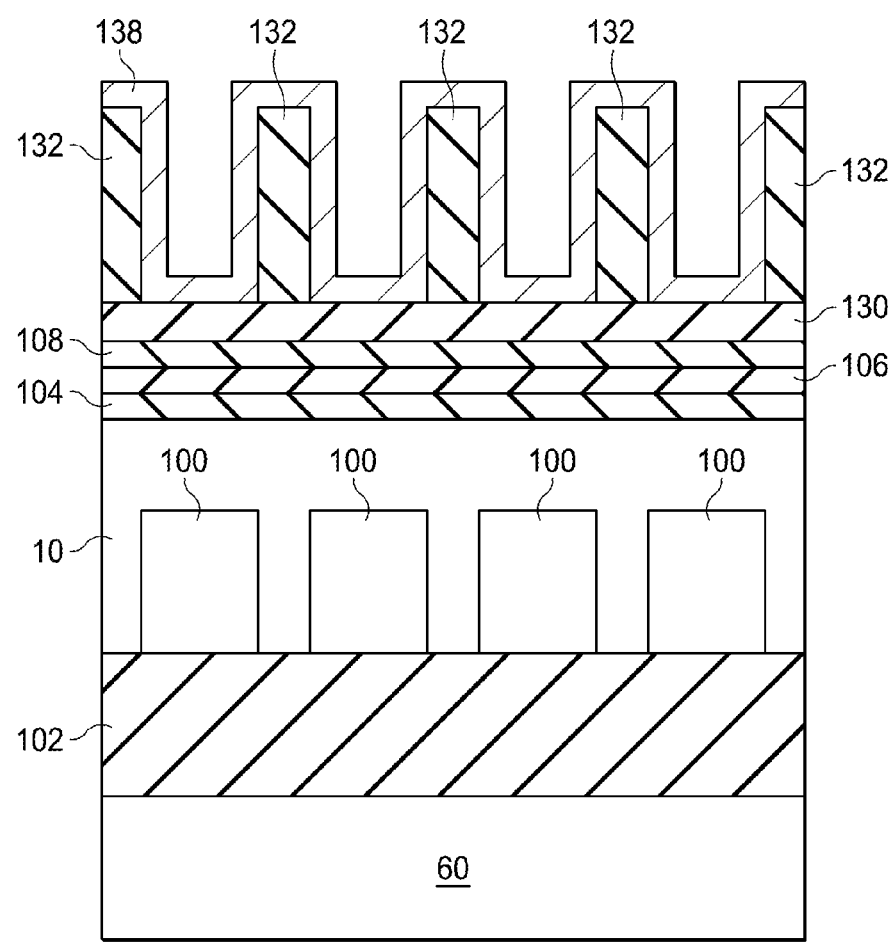
Figure 22:
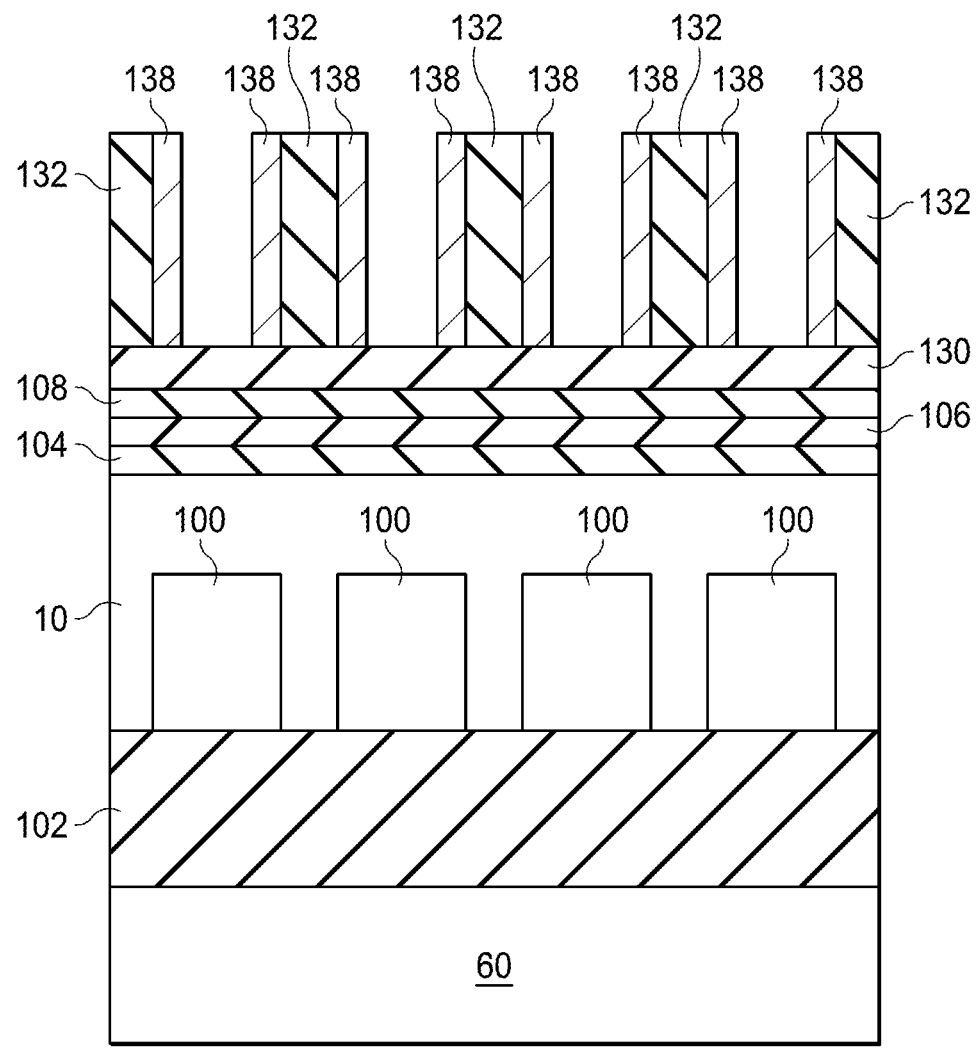
Figure 23:
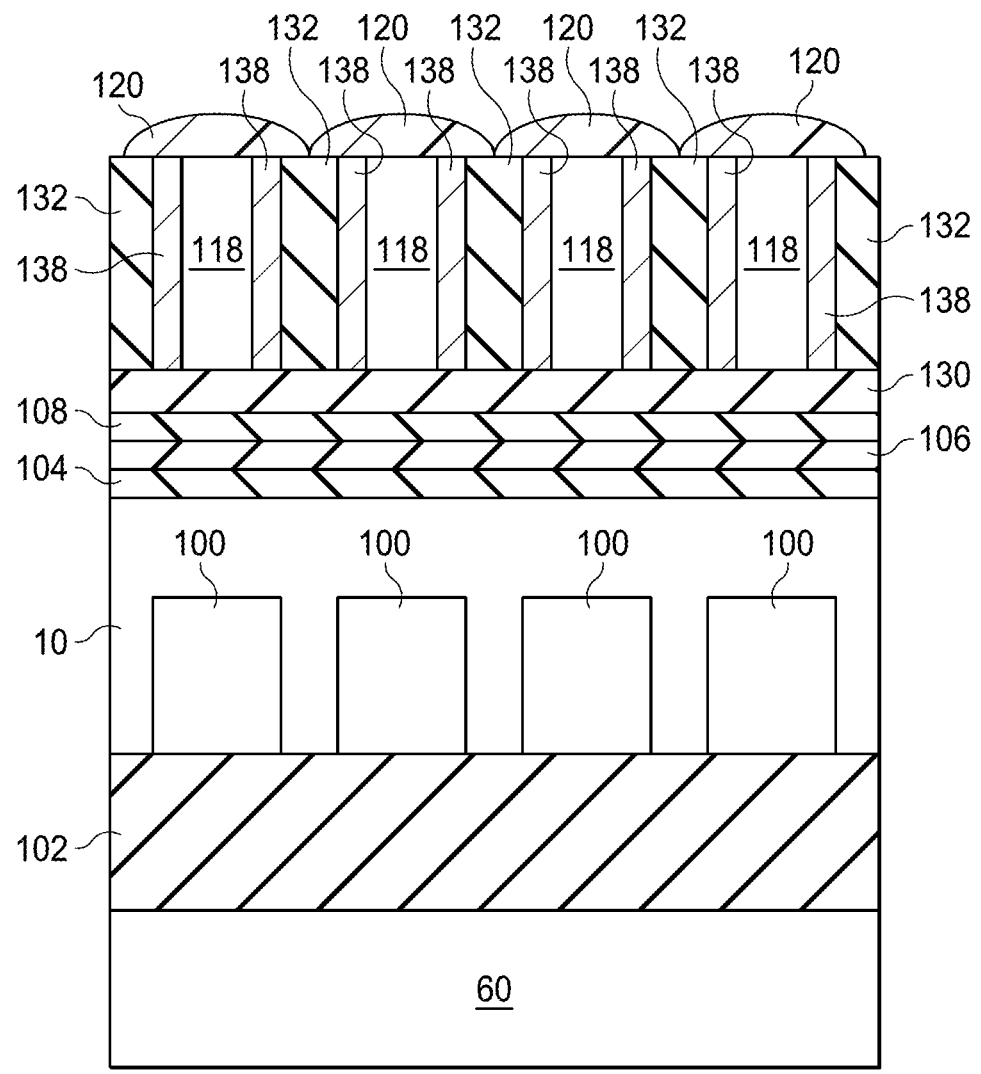

FIGS. 21 through 24 illustrate various intermediate structures during a process according to a still further embodiment. In FIG. 21, the hardmask layer 112 from the structure of FIG. 16 is removed, and a reflective guide layer 136 is formed on the silicon oxide layer 132 and in the recesses 134 as discussed with respect to FIG. 17. In FIG. 22, the reflective guide layer 136 is anisotropically etched such that portions of the reflective guide layer 136 along sidewalls of the recesses 134 remain, while portions of the reflective guide layer 136 on bottom surfaces of the recesses 134 and top surfaces of the silicon oxide layer 132 are removed, similar to as discussed with respect to FIG. 18. In other embodiments, portions of the reflective guide layer 136 may remain over top surfaces of the silicon oxide layer 132, such as when using a photolithography process with the etch. In FIG. 23, color filters 118 and microlenses 120 are formed, as discussed with respect to FIG. 9.

FIG. 24 illustrates a portion of an array of color filters 118 in plan view along the top surfaces of the color filters 118, the silicon oxide layer 132, and the reflective guide layer 136 that corresponds to a portion of the array of photo diodes 100. The color filters 118 comprise red color filters 118R, blue color filters 118B, and green color filters 118G patterned in a Bayer pattern. The reflective guide layer 136 covers the sidewalls of the silicon oxide layer 132 to direct light to the underlying photo diodes 100, and top surfaces of the silicon oxide layer 132 are exposed.

As illustrated in the figures, a silicon oxide layer 110 or 132 may form at least a portion of a grid among the array of color filters 118, such as having a protruding portion of the silicon oxide layer 110 or 132 between neighboring ones of the color filters 118. Further, the reflective guide layer 116 or 136 can be along the sidewalls of the protruding portions of the silicon oxide layer 110 or 132, respectively, to further form the grid among the array of color filters 118. In some embodiments, a hardmask layer 112 and/or portions of the reflective guide layer 116 or 136 are on top surfaces of the protruding portions of the silicon oxide layer 110 or 132, respectively. Further, in some embodiments, there is an one-to-one correspondence between the photo diodes 100 and the color filters 118 in the respective arrays. Hence, for example, each of the photo diodes 100 corresponds to one of the color filters 118, and each of the color filters 118 corresponds to one of the photo diodes 100.

Additionally, distances of optical paths between of the microlenses 120 and corresponding photo diodes 100 in the substrate 10 may be reduced according to some embodiments. For example, an optical path from a top surface of the color filters 118 to the backside 68 of the substrate 10 may be between about 3,000 Å and about 10,000 Å. In embodiments comprising a grid as described above and a reduced optical path, enhanced light sensitivity of the photo diodes, increased quantum efficiency (QE), and a reduced cross-talk between pixels (such as by guiding light from a microlens to its corresponding photo diode) may be achieved. Additionally, a signal-to-noise ratio of 10 dB (SNR10), better color shading uniformity (CSU), and improved chief ray angle (CRA) may be achievable. Further, processes of some embodiments, such as those described herein, may be easily incorporated since the individual processes (e.g., CVD, RIE, etc.) may be routinely used in semiconductor processing.

According to an embodiment, a structure comprises a substrate comprising photo diodes, an oxide layer on the substrate, recesses in the oxide layer and corresponding to the photo diodes, a reflective guide material on a sidewall of each of the recesses, and color filters each being disposed in a respective one of the recesses. The oxide layer and the reflective guide material form a grid among the color filters, and at least a portion of the oxide layer and a portion of the reflective guide material are disposed between neighboring color filters.

According to another embodiment, a structure comprises a substrate comprising an array of photo diodes, a silicon oxide layer over the substrate, an array of recesses in the silicon oxide layer corresponding to the array of photo diodes, a reflective guide material on sidewalls of each of the recesses, color filters each in a respective one of the recesses, and lenses each on a respective one of the color filters. The reflective guide material comprises a metal, a silicon nitride, a material with a refractive index greater than 2.0, or a combination thereof. The reflective guide material and the silicon oxide layer forming a grid between the color filters.

A further embodiment is a method. The method comprises forming an oxide layer over a substrate, the substrate comprising photo diodes; forming recesses in the oxide layer, the recesses corresponding to the photo diodes; forming a conformal layer of reflective guide material over the oxide layer and in the recesses; removing portions of the reflective guide material in bottom portions of the recesses; forming color filters each in a respective one of the recesses, a portion of the oxide layer and a portion of the reflective guide material being disposed between each pair of adjacent color filters; and forming lenses each over a respective one of the color filters.

Although embodiments of the present disclosure and its advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A structure comprising:
a substrate comprising photo diodes, the substrate having a first side and a second side opposite from the first side;
an interconnect structure on the first side of the substrate;
an oxide layer on the second side of the substrate;
an additional layer over the oxide layer, recesses extending through the additional layer and the oxide layer and corresponding to the photo diodes, the recesses having a depth in the oxide layer less than a thickness of the oxide layer;
a reflective guide material on a sidewall of the additional layer and the oxide layer of each of the recesses; and
color filters each being disposed in a respective one of the recesses, the oxide layer and the reflective guide material forming a grid among the color filters, at least a portion of the oxide layer and a portion of the reflective guide material being disposed between neighboring color filters.

2. The structure of claim 1, wherein the reflective guide material comprises a metal.

3. The structure of claim 1, wherein the reflective guide material comprises a material with a refractive index greater than 2.0.

4. The structure of claim 1, wherein the reflective guide material comprises silicon nitride.

5. The structure of claim 1, wherein the reflective guide material is on each sidewall of the recesses.

6. The structure of claim 1, wherein the additional layer comprises a metal, a silicon nitride, or a combination thereof.

7. The structure of claim 1, wherein the additional layer comprises a material with a refractive index greater than 2.0.

8. The structure of claim 1, wherein a first surface of the additional layer, a second surface of the reflective guide material, and a third surface of the color filters are co-planar, the first surface, the second surface, and the third surface being distal from the substrate.

9. The structure of claim 1 further comprising:
an anti-reflection coating (ARC) structure disposed between the substrate and the oxide layer; and
lenses each being disposed on a respective one of the color filters.

10. The structure of claim 1, wherein the sidewall of the recesses are free of the additional layer.

11. A structure comprising:
a substrate comprising an array of photo diodes;
a silicon oxide layer over the substrate, the silicon oxide layer comprising an array of recesses corresponding to the array of photo diodes, the silicon oxide layer having a first surface most distal from the substrate and a second surface most proximate to the substrate, the silicon oxide layer being free of metallization patterns routing electrical signals to electrical circuitry;
an additional layer over the silicon oxide layer such that the silicon oxide layer is interposed between the additional layer and the substrate, the additional layer extending between adjacent recesses, the additional layer not extending along sidewalls of the recesses;
a reflective guide material on sidewalls of each of the recesses and the additional layer, the reflective guide material comprising a metal, a silicon nitride, a material with a refractive index greater than 2.0, or a combination thereof;
color filters each being in a respective one of the recesses, the reflective guide material and the silicon oxide layer forming a grid between the color filters; and
lenses each being on a respective one of the color filters.

12. The structure of claim 11 further comprising a silicon nitride layer adjacent the silicon oxide layer, the silicon nitride layer being disposed between the silicon oxide layer and the substrate, each of the recesses being openings through the silicon oxide layer to the silicon nitride layer.

13. The structure of claim 11, wherein the additional layer comprises a metal, a silicon nitride, a material with a refractive index greater than 2.0, or a combination thereof, the additional layer further forming a portion of the grid between the color filters.

14. The structure of claim 11, wherein each of the lenses adjoins a surface of the silicon oxide layer, a surface of a respective one of the color filters, and a surface of the reflective guide material.

15. A method comprising:
forming an oxide layer over a backside of a substrate, the substrate comprising photo diodes, an interconnect structure being on a front side of the substrate;
forming recesses in the oxide layer, the recesses corresponding to the photo diodes;
forming a conformal layer of reflective guide material over the oxide layer and in the recesses;
removing portions of the reflective guide material in bottom portions of the recesses;
forming color filters each in a respective one of the recesses, a portion of the oxide layer and a portion of the reflective guide material being disposed between each pair of adjacent color filters;
planarizing the conformal layer and the color filters such that an uppermost surface of the conformal layer is level with an uppermost surface of the color filters; and
forming lenses each over a respective one of the color filters such that the color filters are interposed directly between the lenses and the substrate.

16. The method of claim 15 further comprising forming a hardmask layer over the oxide layer, the recesses being formed through the hardmask layer, and the forming the conformal layer of the reflective guide material further being over the hardmask layer.

17. The method of claim 15 further comprising:
forming a hardmask layer over the oxide layer, the recesses being formed through the hardmask layer; and
after forming the recesses, removing the hardmask layer.

18. The method of claim 15 further comprising forming a silicon nitride layer over the substrate, the oxide layer being formed immediately adjacent and over the silicon nitride layer.

19. The method of claim 15, wherein the reflective guide material comprises a metal, a silicon nitride, a material with a refractive index greater than 2.0, or a combination thereof.

20. A structure comprising:
a substrate comprising an array of photo diodes, the substrate having a first side and a second side opposite from the first side, the photo diodes each extending from the first side of the substrate into the substrate;
an interconnect structure on the first side of the substrate;
a silicon oxide layer on the second side of the substrate and a patterned layer on the silicon oxide layer, the silicon oxide layer and the patterned layer having an array of recesses corresponding to the array of photo diodes, the silicon oxide layer having no metallization patterns communicating electrical signals to electrical circuitry therein, the silicon oxide layer having a first surface most distal from the substrate and a second surface most proximate to the substrate, bottom surfaces of the recesses each being a third surface of the silicon oxide layer;
a reflective guide material on sidewalls of each of the recesses, the reflective guide material comprising a metal, a silicon nitride, a material with a refractive index greater than 2.0, or a combination thereof;
color filters each being in a respective one of the recesses and disposed between and contacting the reflective guide material on the sidewalls of the respective one of the recesses, the color filters each extending from the respective third surface of the silicon oxide layer to the first surface of the silicon oxide layer, the reflective guide material and the silicon oxide layer forming a grid between the color filters; and
lenses each being on and contacting a respective one of the color filters.

* * * * *